(12) United States Patent
Tosi et al.

(10) Patent No.: US 11,569,408 B2
(45) Date of Patent: Jan. 31, 2023

(54) SEMICONDUCTOR-METAL CONTACTS WITH SPONTANEOUS AND INDUCED PIEZOELECTRIC POLARIZATION

(71) Applicant: Silanna UV Technologies Pte Ltd, Singapore (SG)

(72) Inventors: Guilherme Tosi, Yeerongpilly QLD (AU); Norbert Krause, Hawthorne QLD (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 84 days.

(21) Appl. No.: 17/247,593

(22) Filed: Dec. 17, 2020

(65) Prior Publication Data

US 2021/0143298 A1 May 13, 2021

Related U.S. Application Data

(63) Continuation of application No. PCT/IB2019/055897, filed on Jul. 10, 2019.

(60) Provisional application No. 62/697,760, filed on Jul. 13, 2018.

(51) Int. Cl.
| | |
|---|---|
| *H01L 33/06* | (2010.01) |
| *H01L 33/10* | (2010.01) |
| *H01L 33/32* | (2010.01) |
| *H01L 33/40* | (2010.01) |
| *H01L 33/00* | (2010.01) |

(52) U.S. Cl.
CPC ......... *H01L 33/0025* (2013.01); *H01L 33/06* (2013.01); *H01L 33/10* (2013.01); *H01L 33/32* (2013.01); *H01L 33/405* (2013.01)

(58) Field of Classification Search
CPC ..... H01L 33/0025; H01L 33/06; H01L 33/10; H01L 33/32; H01L 33/405
See application file for complete search history.

(56) References Cited

U.S. PATENT DOCUMENTS

| | | | |
|---|---|---|---|
| 9,401,452 B2 * | 7/2016 | Northrup | H01S 5/0421 |
| 9,871,165 B2 | 1/2018 | Atanackovic et al. | |
| 2013/0099141 A1 * | 4/2013 | Chua | H01L 33/26 |
| | | | 438/47 |
| 2014/0166977 A1 | 6/2014 | Shur et al. | |

(Continued)

OTHER PUBLICATIONS

International Search Report dated Oct. 23, 2019 for PCT Patent Application No. PCT/IB2019/055897.

*Primary Examiner* — Mark W Tornow
(74) *Attorney, Agent, or Firm* — MLO, a professional corp.

(57) ABSTRACT

In some embodiments, a semiconductor structure comprises a semiconductor layer, a metal layer, and a contact layer adjacent to the metal layer, and between the semiconductor layer and the metal layer. The contact layer can comprise one or more piezoelectric materials comprising spontaneous piezoelectric polarization that depends on material composition and/or strain, and a region comprising a gradient in materials composition and/or strain adjacent to the metal layer. In some embodiments, a light emitting diode (LED) device comprises an n-doped short period superlattice (SPSL) layer, an intrinsically doped AlN/GaN SPSL layer adjacent to the n-doped SPSL layer, a metal layer, and an ohmic-chirp layer between the metal layer and the intrinsically doped AlN/GaN SPSL layer.

21 Claims, 24 Drawing Sheets

(56) References Cited

U.S. PATENT DOCUMENTS

2014/0273323 A1 9/2014 Kim
2017/0084779 A1* 3/2017 Moe .................... H01L 33/0075

* cited by examiner

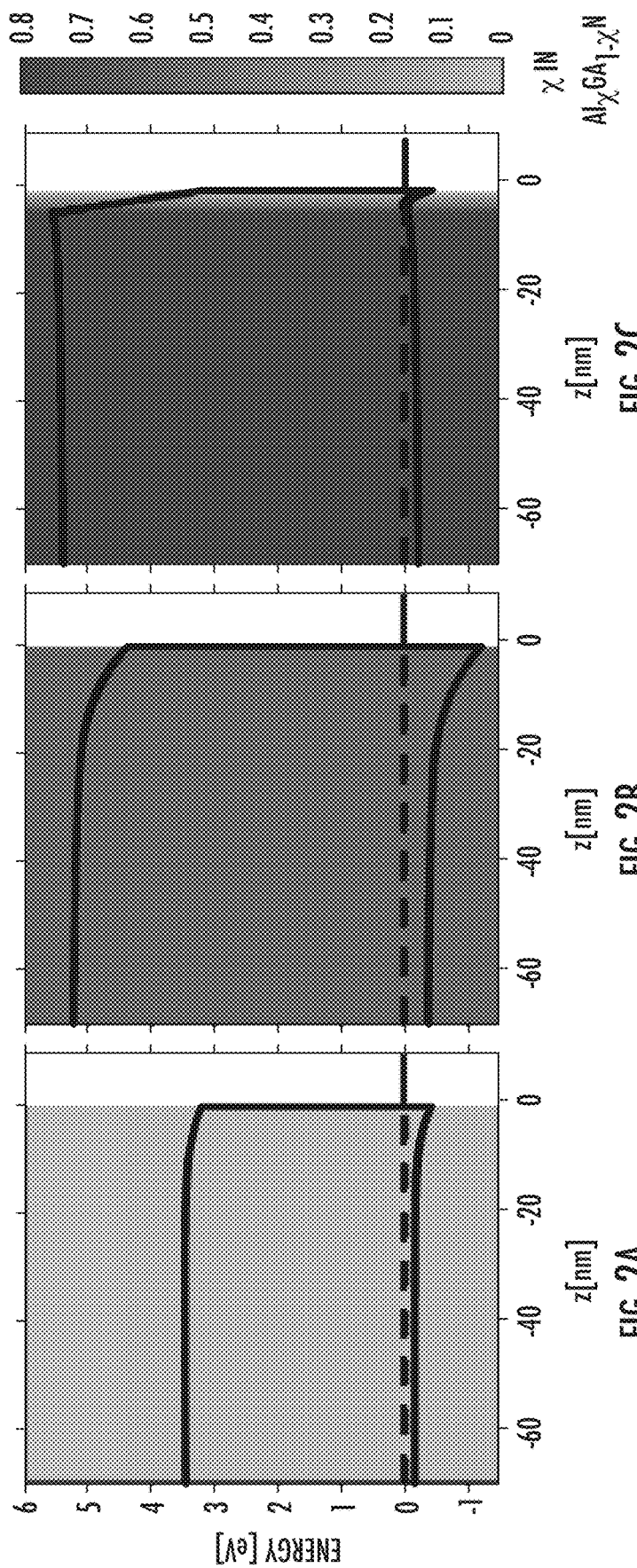

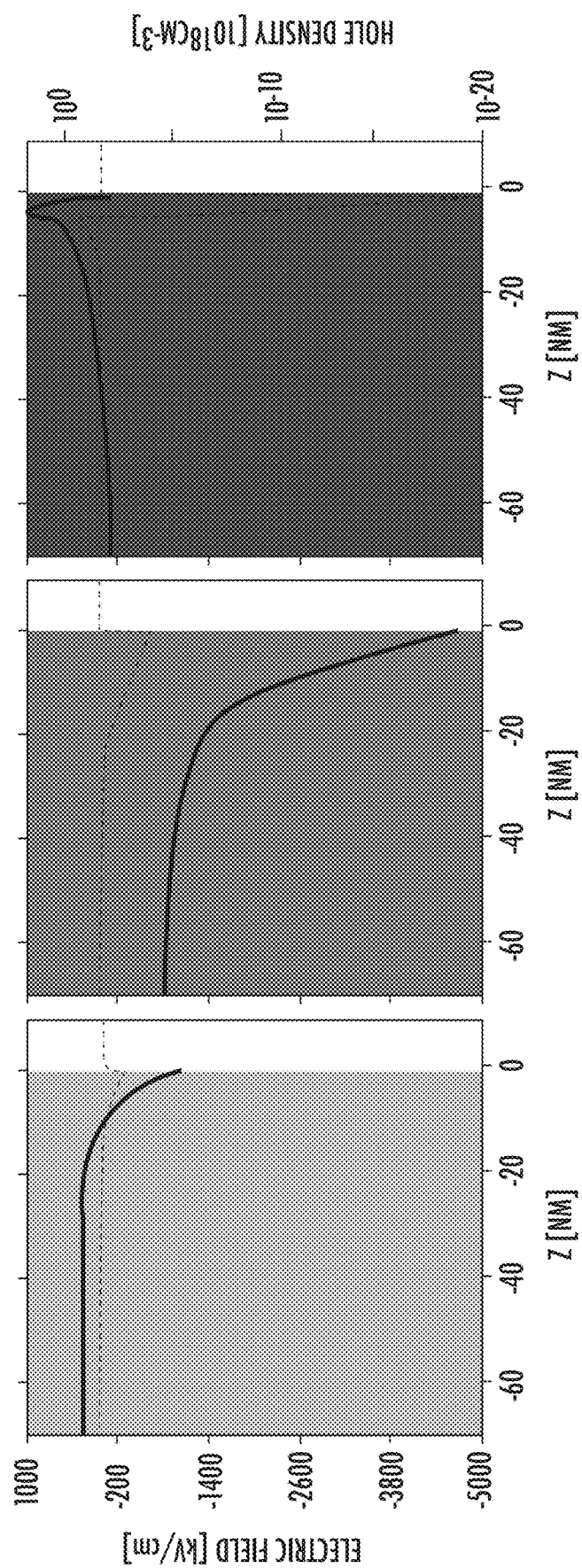

| @ λ = 265nm | $N_1$ | $N_2$ | R | PHASE |
|---|---|---|---|---|
| AlGaN/Al | 2.55 | 0.16+2.7i | 89% | -93° |
| AlGaN/Ti | 2.55 | 1.05+2.1i | 38% | -85° |
| AlGaN/Rh | 2.55 | 0.79+2.5i | 54% | -92° |
| AlGaN/Pd | 2.55 | 0.95+2.3i | 45% | -88° |

SEMICONDUCTOR-METAL CONTACTS WITH SPONTANEOUS AND INDUCED PIEZOELECTRIC POLARIZATION

RELATED APPLICATIONS

This application is a continuation of PCT Application PCT/IB2019/055897 filed on Jul. 10, 2019 and entitled "Semiconductor-Metal Contacts with Spontaneous and Induced Piezoelectric Polarization, which claims benefit of U.S. Provisional Patent Application No. 62/697,760 filed on Jul. 13, 2018 and entitled "Tailored Semiconductor-Metal Contact Resistance Via Spontaneous and Induced Piezoelectric Polarization Engineering", all of which are incorporated herein by reference in their entirety for all purposes.

BACKGROUND

Wurtzite semiconductors are behind a great number of applications in the modern optoelectronic and electronic industry. Their broad bandgap coverage makes them the materials of choice in many optoelectronic devices such as light emitting diodes, laser diodes, photodetectors and solar cells, with wavelengths ranging from infra-red to deep-ultraviolet. At the same time, their wide bandgaps, in particular for AlGaN, w-BN and ZnO, are responsible for their stable high-temperature performance and resistance against breakdown, which makes them suitable for usage in high-power diodes and transistors.

Wurtzite semiconductors also have uniquely strong piezoelectric properties, and are widely used in transducers and high-mobility transistors, the latter due to the strong carrier concentration at piezoelectric heterojunctions. However, these materials also present fundamental challenges that often limit their wider adoption. In particular, the wider the bandgap, the harder it is to achieve efficient doping, which is largely due to high ionization energies, especially for acceptors. At the same time, the usually high Schottky resistance to metals leads to poor contact properties, which in turn generates strong heating during operation.

One particular application of wurtzite semiconductors, deep-UV LEDs, is currently under strong development given their enormous potential for sterilization, water treatment and other applications. However, the output power performance of conventional ultraviolet c-band light (UVC) LEDs has been plagued by the lack of low resistive and transparent p-regions. Two conventional approaches to solve these problems have been adopted. The first conventional approach uses p-GaN layers, which provide high enough hole densities and relatively low operation voltages, but in turn are highly UVC-absorptive due to the lower GaN bandgap. The second conventional approach uses p-AlGaN layers with high aluminium content which, despite being non-UVC-absorptive, provide very low hole densities and very large operation voltages. As a result, most of the power consumed by conventional UVC LEDs is not converted into useful light, either due to high absorption inside the LED structure, or due to high dissipation into the p-contact resistance.

SUMMARY

In some embodiments, a semiconductor structure comprises a semiconductor layer, a metal layer, and a contact layer adjacent to the metal layer, and between the semiconductor layer and the metal layer. The contact layer can comprise one or more piezoelectric materials comprising spontaneous piezoelectric polarization that depends on material composition, and a region comprising a gradient in materials composition adjacent to the metal layer.

In some embodiments, a semiconductor structure comprises a semiconductor layer, a metal layer, and a contact layer adjacent to the metal layer, and between the semiconductor layer and the metal layer. The contact layer can comprise one or more piezoelectric materials comprising induced piezoelectric polarization that depends on strain, and a gradient in strain over a region adjacent to the metal layer.

In some embodiments, a light emitting diode (LED) device comprises an n-doped short period superlattice (SPSL) layer, an intrinsically doped AlN/GaN SPSL layer adjacent to the n-doped SPSL layer, a metal layer, and an ohmic-chirp layer. The beginning of the ohmic-chirp layer is adjacent to the intrinsically doped AlN/GaN SPSL layer, and an end of the ohmic-chirp layer is adjacent to the metal layer. The ohmic-chirp layer can further comprise an AlN/GaN SPSL comprising alternating AlN and GaN sublayers, and a gradient in thicknesses of the alternating AlN and GaN sublayers in a region of the ohmic-chirp layer adjacent to the metal layer.

BRIEF DESCRIPTION OF THE DRAWINGS

FIG. 2A is a plot of simulated conduction and valence bands and hole quasi-fermi level of a GaN/metal interface, in accordance with some embodiments.

FIG. 2B is a plot of simulated conduction and valence bands and hole quasi-fermi level of an $Al_{0.8}Ga_{0.2}N$/metal interface, in accordance with some embodiments.

FIG. 2C is a plot of simulated conduction and valence bands and hole quasi-fermi level of an $Al_{0.8}Ga_{0.2}N$ material that grades down to GaN over the last 4 nm before the metal interface, in accordance with some embodiments.

FIG. 3A is a plot of the electric field and hole density of an GaN/metal interface, in accordance with some embodiments.

FIG. 3B is a plot of electric field and hole density of an $Al_{0.8}Ga_{0.2}N$/metal interface, in accordance with some embodiments.

FIG. 3C is a plot of electric field and hole density of an $Al_{0.8}Ga_{0.2}N$ material that grades down to GaN over the last 4 nm before the metal interface, in accordance with some embodiments.

DETAILED DESCRIPTION

Figure 1A:
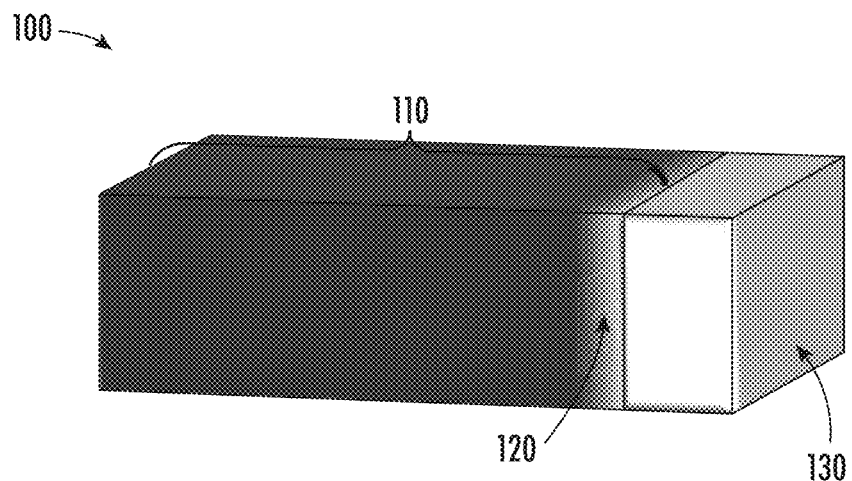
FIG. 1A is a schematic diagram of a simplified example of a metal-semiconductor contact, in accordance with some embodiments.

Semiconductor-metal contacts with spontaneous and/or induced piezoelectric polarization are described herein. In some embodiments, steeply varying the material composition of a piezoelectric semiconductor, adjacent to a metal contact, generates a strong electric field through spontaneous piezoelectric polarization. In turn, the strong electric field can substantially alter the transport properties through that interface, for example either lowering or increasing the formed contact resistance. The unexpected consequence is that the contact resistance of a semiconductor-metal structure can be tailored by including a "contact layer" with a steeply varying material composition of a piezoelectric semiconductor adjacent to the metal contact (i.e., between a semiconductor layer and the metal contact). As described herein, such structures are applicable in a wide variety of devices and materials systems. For example, ohmic p- or n-contacts with low contact resistance can be created between wide bandgap semiconductors and metal layers by utilizing the aforementioned contact layer. Alternatively, the height of a Schottky barrier between a semiconductor and a metal can be modified by utilizing the aforementioned contact layer.

The versatile approaches described herein, using different types of contact layers with steeply varying material compositions of piezoelectric semiconductors adjacent to metal contacts, are applicable in many applications, including but not limited to optoelectronic devices with wavelengths ranging from infra-red to deep-ultraviolet (e.g., light emitting diodes (LEDs), laser diodes, photodetectors, and solar cells), high-power diodes, high-power transistors, transducers and high-mobility transistors.

The steeply varying material compositions of piezoelectric semiconductors within the contact layers can be realized in a number of ways, including using smooth compositional grading (i.e., a smoothly varying compositional gradient), using structures with one or more abrupt changes in composition (e.g., stepped layers), or using short-period superlattices (SPSLs) with changing sublayer thicknesses (e.g., chirp layers). SPSLs typically contain thin alternating wide bandgap sublayers (barriers) and narrow bandgap sublayers (wells). For example, the sublayers can be less than approximately 5 nm thick, or less than 20 monolayers (MLs), or less than 10 MLs, or less than 2 MLs, or from 0.1 to 20 MLs. In some embodiments, the compositional gradients in the regions adjacent to the contact layers described herein are steep enough to induce piezoelectric polarization within the region, wherein "steep" is defined by the following description. For example, if the region contains AlGaN materials with changing composition (e.g., in a smooth gradient of $Al_xGa_{1-x}N$, or in a SPSL with alternating layers of AlN and GaN where the average composition changes over the SPSL), then the composition can vary from x equals about 0.8 (or 80%) to x equals about 0.2 (or 20%) over about 8 nm. In other words, the compositional gradient can have a value of about 60% over 8 nm, or the composition can change by 7.5% per nanometer. More generally, for $Al_xGa_{1-x}N$ materials, the composition can change from 1% to 50% per nanometer, or from 1% to 30% per nanometer, or from 5% to 20% per nanometer. For any materials system capable of induced piezoelectric polarization, the composition can change from about 1% to 100% per nanometer, or from 1% to 50% per nanometer, or from 5% to 50% per nanometer, or from 5% to 30% per nanometer, or by any amount that induces an increased charge density (compared to the charge density without a compositional gradient) through the mechanism of piezoelectric polarization. In some cases, the compositional gradient is made as steep as possible to induce as large a charge as possible, without hindering charge transport. For example, if the composition is changed too quickly, then large energy barriers (e.g., greater than 25 meV) can be formed due to a large conduction band or valence band offset, which can hinder charge transport across the region.

In some embodiments, the steeply varying material compositions of piezoelectric semiconductors within the contact layers occurs over a distance from greater than 0 nm to less than 20 nm, from greater than 0 nm to less than 10 nm, from greater than 0 nm to less than 5 nm, from greater than 0.1 nm to less than 20 nm, from greater than 0.1 nm to less than 10 nm, from greater than 0.1 nm to less than 5 nm, or from 1 nm to 10 nm. In some embodiments, the contact layer forms an ohmic contact between a semiconductor and a metal. In some embodiments, the semiconductor is a wide bandgap semiconductor with bandgaps greater than 1.5 eV, or greater than 2.0 eV, or greater than 2.5 eV, or greater than 3.0 eV, or greater than 4.0 eV, or greater than 5.0 eV, or greater than 6.0 eV, or from 1.5 eV to 7.0 eV, or from 3.0 eV to 7.0 eV.

In some embodiments, the contact layers are "ohmic-chirp" layers and are used to create ohmic (or, low resistance) contacts to metal layers in semiconductor structures and devices (e.g., in structures and devices containing wide bandgap semiconductors). The term "ohmic-chirp" or "ohmic-chirp layer" as used herein, refers to a layer with a steeply varying material composition of piezoelectric semiconductors produced by changing the sublayer thicknesses within an SPSL. The changing the sublayer thicknesses for the wells and/or the barriers within an ohmic-chirp layer can be monotonic or non-monotonic, and can follow any relationship (e.g., linear, parabolic, or other shape). In some embodiments, the ohmic-chirp layers contain piezoelectric materials that have spontaneous and intrinsic polarizations, which are dependent on the material composition gradient.

In some embodiments, the ohmic-chirp layers contain a gradient in the piezoelectric material composition adjacent to the metal contact layer (e.g., by changing the thicknesses of the alternating sublayers within the SPSL). Some non-limiting examples of piezoelectric materials that can be used to form ohmic-chirp layers are AlN, GaN, InN, AlGaN, InGaN, AlInGaN, ZnO, w-BN, and other wurtzite semiconductors.

In some embodiments, the contact layer (e.g., a contact layer with a compositional gradient, or an ohmic-chirp layer) enables an ohmic (or, low resistance) n-contact or a p-contact, and contains a high concentration of electrons or holes, respectively. The terms "n-contact" and "p-contact" as used herein refer to an electrical contact (or connection) between a metal and an n-type or a p-type semiconductor, respectively. In some embodiments, the contact layer is situated between a metal and an n-type or a p-type semiconductor and enables an ohmic (or, low resistance) n-contact or a p-contact between the semiconductor and the metal. In some embodiments, the contact layer forms an ohmic (or, low resistance) n-contact or a p-contact by changing the barrier height and/or barrier width between the semiconductor and the metal. For example, the contact layer can reduce an effective width of a barrier across the contact (i.e., experienced by a carrier traversing the contact) by creating a strong electric field in the contact layer adjacent to the metal, which increases the transport of carriers from the metal to the semiconductor (or vice-versa) across the barrier. In some cases, the barrier width across a contact containing a contact layer (as described herein) is less than 5 nm, or less than 3 nm, or less than 1 nm. In some cases, the barrier height between a contact layer (as described herein) and a metal is less than 0.3 eV, or less than 0.6 eV, or less than 1.3 eV, or less than 2 eV.

The contact layers (e.g., contact layers with compositional gradients, or ohmic-chirp layers) described herein have some relation to structures that utilize polarization doping, in the sense that contact layers also benefit from the large resultant electric fields that result from grading the total aluminium composition. Polarization doping (e.g., p-type) has been previously described (e.g., in Simon et al., Science Vol. 327, Issue 5961, pp. 60-64, 2010. DOI: 10.1126/science.1183226). Polarization doping has also been described within UVC LEDs, such as in U.S. Pat. No. 9,871,165. The contact layers described herein introduce important new modifications that enable the contact resistance of a semiconductor-metal structure to be tailored, such as the inclusion of a layer with a steeply varying material composition of a piezoelectric semiconductor adjacent to the metal contact.

In other embodiments, steeply varying the strain (i.e., creating a strain gradient) of a piezoelectric semiconductor, adjacent to a metal contact, generates a strong electric field through induced piezoelectric polarization. Therefore, in some embodiments, the contact resistance of a semiconductor-metal structure can be tailored by including a contact layer with a piezoelectric semiconductor containing a strain gradient adjacent to the metal contact. In some embodiments, the contact layer with a strain gradient enables an ohmic (or, low resistance) n-contact or p-contact.

In some embodiments, both a strain gradient and a compositional gradient in a piezoelectric semiconductor, adjacent to a metal contact, generate a strong electric field through both spontaneous and induced piezoelectric polarization. Therefore, in some embodiments, the contact resistance of a semiconductor-metal structure can be tailored (e.g., decreased) by including a contact layer with a piezoelectric semiconductor containing both a strain gradient and a compositional gradient adjacent to the metal contact. Depending on the magnitudes of the compositional gradient and the strain gradient within the piezoelectric material in the contact layer, the effect of the compositional gradient can be either larger than, smaller than, or similar to, the effect of the strain gradient.

FIG. 1A is a simple schematic of an example of a semiconductor structure 100 containing a semiconductor-metal junction, whose semiconductor material 110 is piezoelectric and abruptly graded in composition or graded in strain within contact layer 120 adjacent to an interface with a metal contact 130, in accordance with some embodiments. The gradient in local strain and/or difference in composition creates a strong polarization field that modifies the local carrier concentration and transport properties through the interface.

Some non-limiting examples of materials that can be used in the piezoelectric semiconductor 110 (including the strained or graded contact layer 120) in FIG. 1A are AlN, GaN, InN, AlGaN, InGaN, AlInGaN, ZnO, w-BN, and other wurtzite semiconductors. Some non-limiting examples of materials that can be used in the metal contact 130 in FIG. 1A are Al, Ti, Ta, Ni, Pt, Au, Ag, Ru, Os, Co, W, Zn, Sn, Pd, Cu, alloys thereof. In some cases, the metal contact 130 can contain 2 or more layers of metals with different compositions (e.g., a Ti layer and an Al layer). In some embodiments, the metal contact 130 is incorporated in an optoelectronic device and is reflective at desired optical wavelengths. In such cases, the contact layer 120 can be designed to form a low resistance contact and also be transparent (or mostly transparent) at the desired optical wavelengths.

Figure 1B:
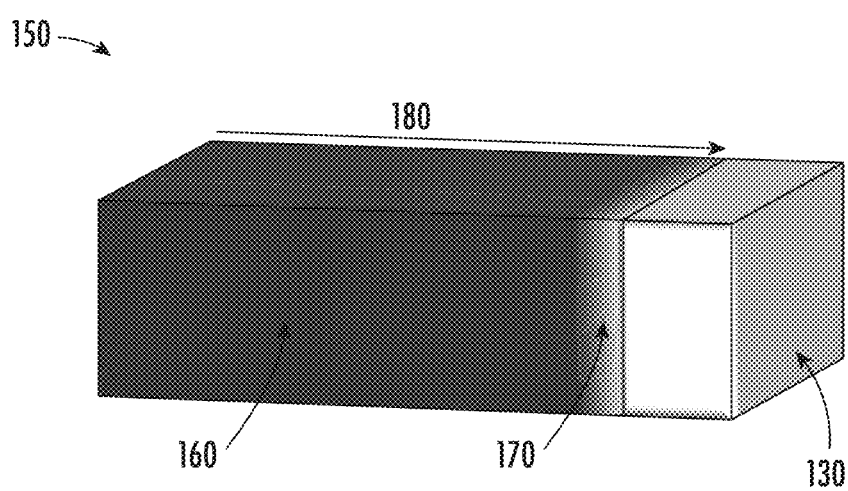
FIG. 1B is a schematic diagram of a simplified example of a metal-AlGaN contact, in accordance with some embodiments.

FIG. 1B is a simple schematic of an example of a semiconductor structure 150 containing a semiconductor-metal junction containing a metal contact 130, a constant composition AlGaN material 160, and a graded AlGaN material 170 forming a contact layer adjacent to the metal contact 130. In the example shown, the graded region 170 is composed of an $Al_xGa_{1-x}N$ material whose aluminium composition x is steeply reduced over a few nanometres adjacent to the metal contact. The metal-polar growth direction 180 (i.e., the orientation of the metal polar faces in layers 160 and 170) is also shown.

In other examples, the composition gradient (e.g., 120 in FIG. 1A) can include abrupt steps in composition within a few nanometres of the metal contact (e.g., 130 in FIG. 1A). In some examples, the graded region in the contact layer (e.g., 120 in FIG. 1A, or 170 in FIG. 1B) can also be composed of an AlN/GaN SPSL containing alternating thin (e.g., less than 20 monolayers (MLs), or less than 10 MLs, or less than 2 MLs, or from 0.1 to 20 MLs) sublayers of AlN and GaN (or, in some embodiments, alternating layers of $Al_xGa_{1-x}N$ with different compositions x). The AlN/GaN SPSL layer can begin or end with AlN, GaN, or $Al_xGa_{1-x}N$.

In some cases, an "AlN/GaN SPSL" contains alternating sublayers of AlN and GaN, and the AlN and/or GaN sublayers contain less than 1 ML of AlN and/or GaN respectively, and therefore, in some regions (or nanoregions) of the layer mixed compounds $Al_xGa_{1-x}N$ can still exist. Similarly, in some cases, an "AlN/GaN SPSL" contains alternating sublayers of AlN and GaN, and the AlN and/or GaN sublayer thicknesses contain non-integer numbers of MLs. In such cases, in some regions (or nanoregions) of the layer mixed compounds $Al_xGa_{1-x}N$ can still exist within the contact layer. In some embodiments, AlN/GaN SPSLs contain regions of non-integer sublayer thicknesses, and regions containing sublayers with integer thicknesses. In some embodiments, AlN/GaN SPSLs of different integer sublayer thicknesses of either AlN or GaN or both can coexist laterally next to each other so that the average composition is non-integer on a larger scale. In some embodiments, AlN/GaN SPSLs contain regions where sublayers with different $Al_xGa_{1-x}N$ compositions (i.e., sublayers with different values of x) exist next to each other.

In some embodiments, a graded (or chirped) AlN/GaN SPSL can be used as a contact layer in semiconductor-metal junctions, and contains an AlN/GaN SPSL with a gradient in the AlN, GaN and/or $Al_xGa_{1-x}N$ sublayer thicknesses. For example, the AlN sublayers can be thicker at the beginning of the SPSL (farther from the metal contact) and thinner at the end of the SPSL (nearer to the metal contact). In another example, the GaN sublayers can be thinner at the beginning of the SPSL (farther from the metal contact) and thicker at the end of the SPSL (nearer to the metal contact). In another example, the AlN sublayers can be thicker at the beginning of the SPSL (farther from the metal contact) and thinner at the end of the SPSL (nearer to the metal contact), and the GaN sublayers can be thinner at the beginning of the SPSL (farther from the metal contact) and thicker at the end of the SPSL (nearer to the metal contact).

In some embodiments, the structure in FIG. 1B is used to facilitate hole transport at the interface between the contact layer 170 and the metal contact 130, in which case the direction 180 of the metal polar face of the AlGaN material in layers 160 and 170 is towards the metal contact, as shown in FIG. 1B.

In the example structure shown in FIG. 1B, a high-bandgap AlGaN region 160, possibly p-doped, serves as a hole transport material. It is followed by a steeply graded region 170, from AlGaN to GaN, over a few nanometres scale. In some cases, the graded region 170 (or a portion thereof) is also p-doped. The structure is then terminated with a metal contact 130, e.g. aluminium. In other examples, the high-bandgap region 160 can be n-doped, and the steeply graded region 170 can facilitate electron transport at the interface with metal contact 130 (i.e., making a low resistance n-contact). As will be described more completely below, in the case of n-contacts, the polar faces of the piezoelectric materials and/or the direction of the compositional gradient will be reversed. Similarly, the resistance of semiconductor metal interfaces can be increased (rather than reduced), by reversing the polar faces of the piezoelectric materials and/or the direction of the compositional gradient.

In some embodiments, the structure in FIG. 1B is part of a deep-UV LED, in which case the bandgap of the homogeneous AlGaN region 160 is preferably high enough as to be transparent to the LED emission wavelength. The term "LED", as used herein, refers to any type of light emitting diode, including a laser diode.

The structures shown in FIGS. 1A and 1B are advantageous because they improve carrier transport across the semiconductor-metal structure (or contact, or interface) compared to conventional structures, and can provide high carrier densities to the device in which they are incorporated at relatively low operating voltages.

FIG. 2A shows simulated conduction and valence bands (solid lines) and hole quasi-Fermi level (dashed line) of a GaN/metal interface. FIG. 2B shows simulated conduction and valence bands (solid lines) and hole quasi-Fermi level (dashed line) of an $Al_{0.8}Ga_{0.2}N$/metal interface. FIG. 2C shows the simulated conduction and valence bands (solids lines) and hole quasi-fermi level (dashed line) of a structure with a $Al_{0.8}Ga_{0.2}N$ material and a contact layer containing a smooth compositional gradient from $Al_{0.8}Ga_{0.2}N$ down to GaN over the last 4 nm before the metal interface. The GaN and AlGaN materials of the examples in FIGS. 2A-2C are p-type and contain $1.5 \times 10^{18}$ cm$^{-3}$ magnesium dopants.

FIG. 3A shows the simulated electric field (dashed line) and hole density (solid line) of the GaN/metal interface simulated in FIG. 2A. FIG. 3B shows the simulated electric field (dashed line) and hole density (solid line) of the Al$_{0.8}$Ga$_{0.2}$N/metal interface simulated in FIG. 2B. FIG. 3C shows the simulated electric field (dashed line), due to spontaneous and piezoelectric polarization, and hole density (solid line) of an Al$_{0.8}$Ga$_{0.2}$N material that grades down to GaN over the last 4 nm before the metal interface, simulated in FIG. 2C.

In FIG. 2A the band structure of a p-doped GaN/metal interface shows the formation of a typical Schottky barrier, with a depletion region at the semiconductor interface with a small hole concentration (see FIG. 3A). This is due to an accumulation of negative charges at the semiconductor interface and positive charges at the metal interface. The Schottky barrier is much higher for high aluminium content AlGaN, as shown in FIG. 2B for a p-doped Al$_{0.8}$Ga$_{0.2}$N/metal interface. In that case, the hole concentration is much reduced (as shown in FIG. 3B). Further inside the semiconductor, a much higher acceptor ionization energy (typically hundreds of meV) also yields much lower hole concentrations (as shown in FIG. 3B) and further extends the depletion region (as shown in FIG. 2B) compared to the GaN structure simulated in FIG. 2A.

As a result, due to both the high Schottky barrier and the low hole concentration, a high resistance exists and conduction through the Schottky junction in structures similar to those simulated in FIGS. 2B and 3B (e.g., with p-doped Al$_{0.8}$Ga$_{0.2}$N/metal interfaces with no composition gradient adjacent to the metal layer) is heavily compromised. In the specific case of a UVC LED containing such a Schottky junction, the barrier is operated at reversed biases, and very high voltages are applied to provide sufficient hole injection.

Figure 4:
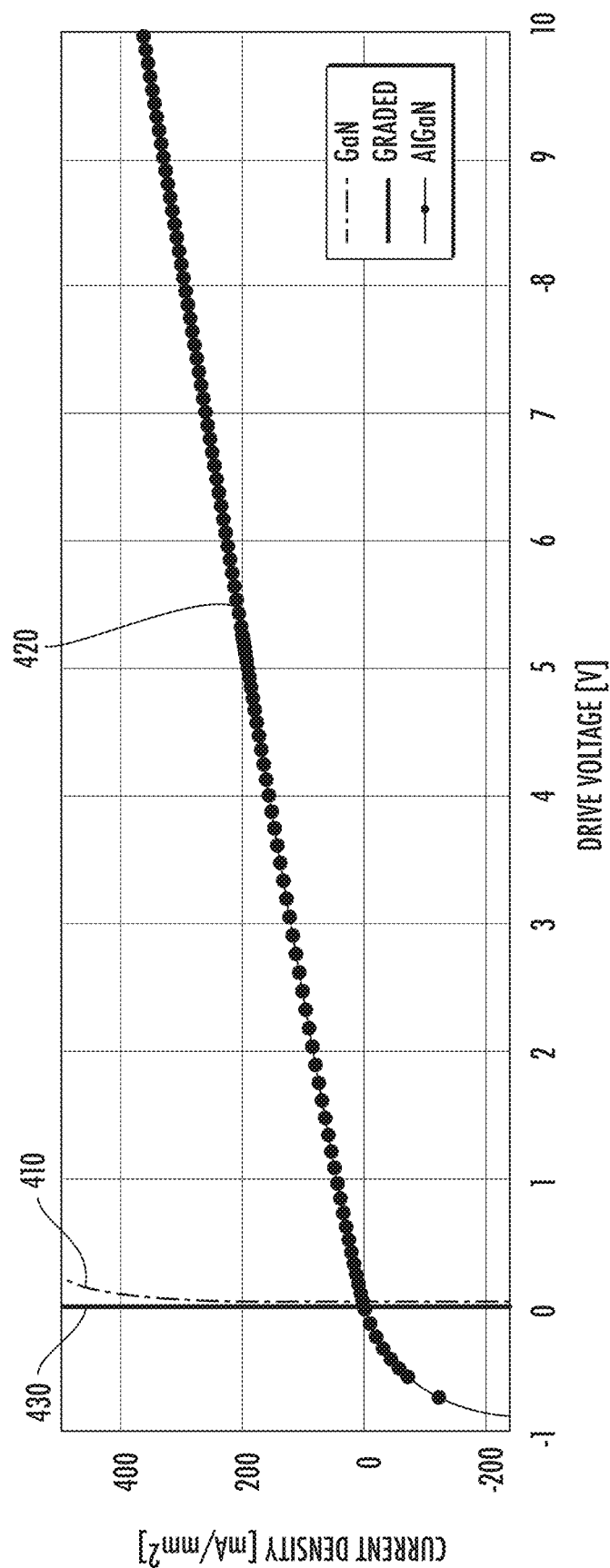
FIG. 4 is a plot of current-voltage (I-V) curves of the structures simulated in FIGS. 2A-2C, in accordance with some embodiments.

FIG. 4 shows a graph with simulated I-V curves 410, 420 and 430 from the structures used to form the plots shown in FIGS. 2A-2C, respectively. Positive voltages (i.e., lower potentials in the semiconductor than the metal) correspond to reversed bias operation in the graph. To form a UVC-LED with a transparent region adjacent to a p-contact, one could choose the structure in FIG. 2B for that region. In that case, as the "AlGaN" curve 420 in FIG. 4 shows, in order to achieve the typical operating current densities in UVC LEDs (i.e., approximately 400 mA/mm$^2$) a voltage on the order of 10 V needs to be applied just across the Schottky barrier between the semiconductor and metal forming the p-contact interface. In such a case, 1.6 W of power is dissipated just into the Schottky resistance. If such a contact region were incorporated into an UVC-LED, for example, then the whole UVC-LED structure would require at least 15 V bias during operation (assuming an extra 5 V is needed for injected holes to go through the intrinsic region of the UVC-LED and recombine radiatively).

Counterintuitively, the high Schottky resistance vanishes in operation of the graded structures similar to those simulated in FIGS. 2C and 3C (and depicted conceptually in FIG. 1B). Not to be limited by theory, there are some attributes of the graded AlGaN layer that could contribute to the reduction in the Schottky resistance. The very steep grading in the AlGaN composition generates a huge polarization field (as shown in FIG. 3C), which strongly bends the valence band (as shown in FIG. 2C) and attracts a high hole density (as shown in FIG. 3C). This high hole density close to the metal interface minimises the width of the Schottky barrier, which facilitates hole injection via tunnelling from the metal. On the other hand, if a thick (e.g., greater than 5 nm) p-GaN layer were inserted between the steeply graded AlGaN and the metal layer in the structure simulated in FIG. 2C, then the contact resistance would counterintuitively increase due to a weaker electric field in the contact layer adjacent to the contact. The electric field in the contact layer adjacent to the metal would be decreased because the thick p-GaN layer would move the strong field created by the graded region of the contact layer farther away from the interface. Beyond what is shown in FIG. 2C, a modified surface composition and hole density (caused by a graded contact layer) could also affect the height of the Schottky barrier. As an overall result, in some embodiments of structures containing a compositional gradient (e.g., as depicted in FIG. 1B), little or no barrier is present for hole transport, despite the progressively increasing bandgap as holes move away from the metal. Therefore, an ohmic contact forms, which, together with the high hole density, provides a contact with very low resistance. Indeed, as seen in the "graded" curve 430 in FIG. 4 (i.e., corresponding to I-V curves from structures similar to those simulated in FIGS. 2C and 3C, and depicted conceptually in FIG. 1B), the voltage, across the contact, needed to provide the operating current densities (i.e., approximately 400 mA/mm$^2$) is as low as a few microvolts, which would dissipate a negligible power (e.g., less than 1 microwatts under operation). Note that this voltage drop in the structure corresponding to the "graded" curve 430 is even smaller that the voltage drop in a pure p-GaN contact (i.e., the "GaN" curve 410, with around 0.1 V simulated in FIG. 4) due to the larger electric fields that effectively reduce the tunnelling barrier width for holes from the metal into the semiconductor, which in turn improves hole transport. Also, the larger electric fields lead to increased hole concentrations at the graded contact layer/metal interface, compared to those created at the p-GaN layer/metal interface, which is also beneficial for hole transport. Such structures are particularly advantageous in deep-UV LEDs since the graded contact region can have a lower contact resistance compared to conventional UV-transparent contact structures.

In some cases, low aluminium content AlGaN sublayers in the graded region can absorb some of the light that is emitted from a UVC LED. However, those layers are thin (e.g., as thin as 2-3 nm, or less), and therefore have relatively low absorption. Moreover, in some embodiments, some of the absorptive GaN layers in a contact layer are placed adjacent to a reflective metal surface, which reduces the total electric field that exists in those layers due to destructive interference. In some embodiments, the total absorption of light (emitted by the LED) in the graded AlGaN layer is about 3%, or less than 10%, or less than 5%, or less than 3%, or less than 1%, or from 1% to 5%, or from 0.1% to 10%.

Figure 5A:
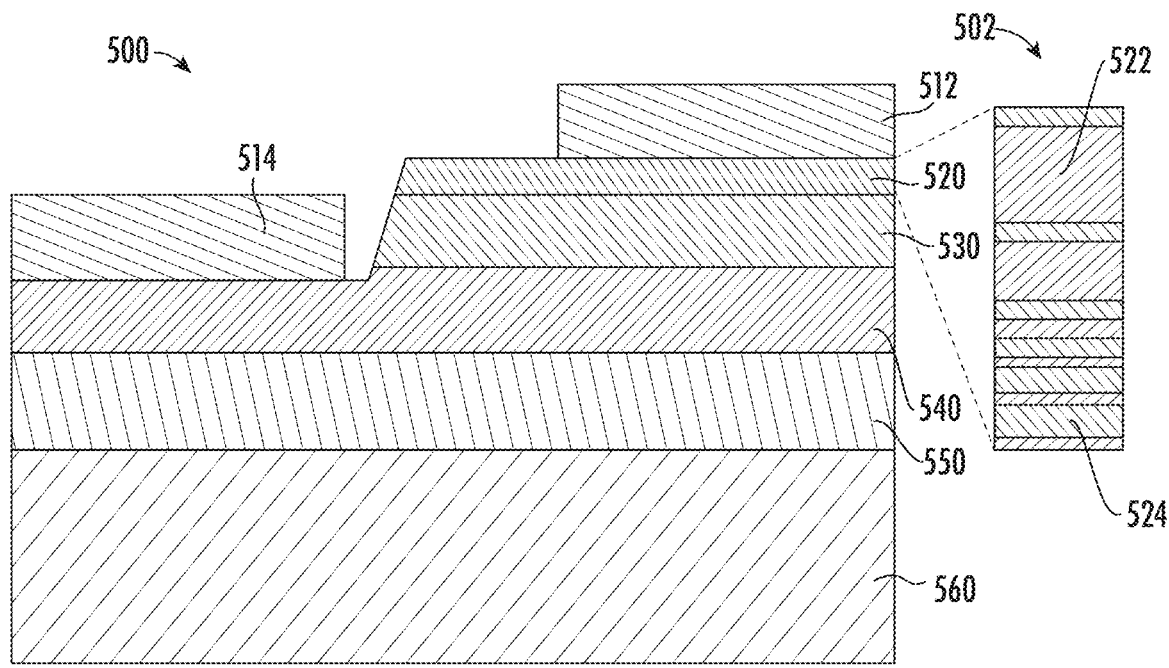
FIG. 5A is a simplified side view schematic of an LED device structure, with an inset showing a layer composition of a short-period superlattice (SPSL) ohmic-chirp layer, in accordance with some embodiments.
Figure 5B:
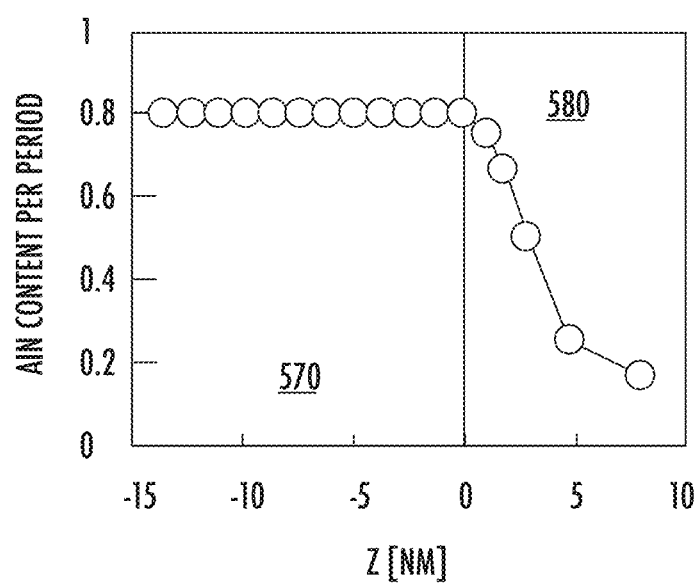
FIG. 5B is a plot of average aluminium content, per period, of the last 15 nm of the intrinsic layer and of the full ohmic-chirp layer of the structure shown in FIG. 5A, in accordance with some embodiments.

An example of an LED with a graded AlN/GaN SPSL version of an ohmic-chirp layer is shown in FIGS. 5A and 5B. FIG. 5A shows a simplified schematic side view of an LED structure 500 including a mesa structure, and an expanded view of the sublayer compositions and thicknesses of the graded AlN/GaN SPSL layer (i.e., the ohmic-chirp layer) 520. The inset 502 shows that the ohmic-chirp layer 520 contains different thicknesses of wider bandgap layers 524 (e.g., AlN layers), and narrower bandgap layers 522 (e.g., GaN layers), which form a graded average composition through ohmic-chirp layer 520. The structure includes a sapphire substrate 560, a thick AlN buffer layer 550, an n-doped SPSL 540, an intrinsic (or unintentionally doped) SPSL 530, an 8 nm thick ohmic-chirp layer 520, and metal contacts 512 and 514. The term "intrinsic", as used herein, refers to a layer with low doping density (e.g., more than an order of magnitude lower doping density) compared to surrounding n-type and/or p-type layers. In some cases, intrinsic layers are unintentionally doped during formation. For example, in a PIN structure, the n-type and p-type layers can have doping densities from about $10^{17}$ cm$^{-3}$ to about $10^{20}$ cm$^{-3}$, and the intrinsic region (or layer) can have doping densities below about $10^{16}$ cm$^{-3}$, or from about $10^{14}$ cm$^{-3}$ to about $10^{16}$ cm$^{-3}$. One metal contact 514 forms an electrical contact with the n-doped SPSL layer 540, and the other metal contact 512 forms an electrical contact with the ohmic-chirp layer 520 on the top of the mesa.

FIG. 5B shows a plot of the average aluminium nitride content per period over regions containing the last 15 nm of the intrinsic layer 570 and of the ohmic-chirp layer 580. The average aluminium nitride content per period is [Al]/([Al+[Ga]), where [Al] and [Ga] are the total atomic fractions of Al and Ga respectively in a period (i.e., in 2 adjacent sublayers in the structure where one sublayer is a GaN layer and the other sublayer is an AlN layer). In this example, only the last ~6 nm of the ohmic-chirp layer is Ga-rich enough to be UVC absorptive (i.e., has bandgap energy lower than the energy of a UVC photon).

Similar to the example in FIG. 1, the total aluminium content in the ohmic chirp layer 520 in the example in FIGS. 5A-5B also has a steep grading close to the metal contact. The example in FIGS. 5A-5B has the last 5 periods of the ohmic-chirp layer 520 doped with magnesium. In other embodiments, the entirety of an ohmic-chirp layer is intrinsically doped, or has a different number of doped periods (e.g., more than 5, less than 5, or all periods doped).

Figure 6A:
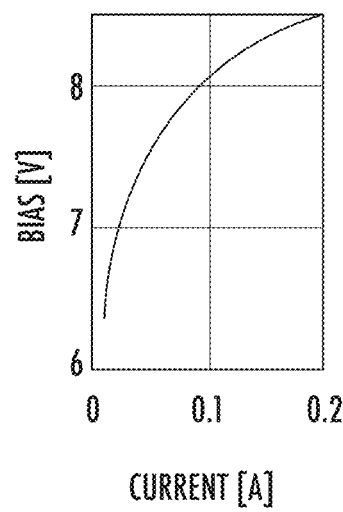
FIG. 6A is a plot of the I-V curve of an LED device, in accordance with some embodiments.
Figure 6B:
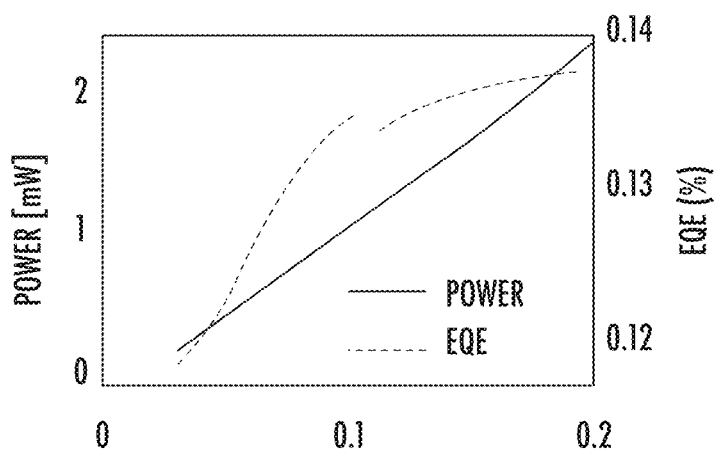
FIG. 6B is a plot of the power and external quantum efficiency versus drive current of an LED device, in accordance with some embodiments.
Figure 6C:
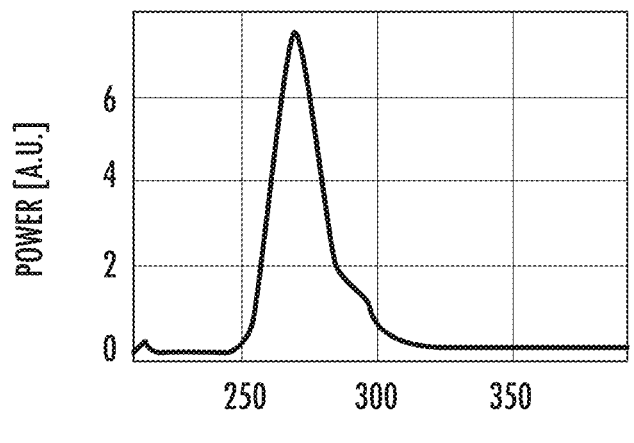
FIG. 6C is a plot of the UV emission spectrum of an LED device, in accordance with some embodiments.

FIGS. 6A-6C show the device performance of an example UVC-LED containing an ohmic-chirp layer structure similar to ohmic-chirp layer 520 shown in FIGS. 5A-5B. FIG. 6A shows an I-V curve, FIG. 6B shows a power (solid line) and external quantum efficiency (dashed line) versus drive current, and FIG. 6C shows the UV emission spectrum. The device containing the ohmic-chirp layer described above can be operated at 200 mA with an applied voltage of 8.5 V, and reaches output powers >2 mW, with an emission spectrum peaked at 270 nm. These results confirm that a UVC LED with a highly transparent p-contact layer based on the ohmic-chirp layer design is feasible. It is important to note that in this device no attempt was made to use the benefits of having a transparent p-contact layer, for example, to optimize the light extraction efficiency by using a reflective metal contact. Furthermore, even better transport performance can be expected by improving the ohmic-chirp layer structure, as described below.

To better explain the device operation, full quantum transport simulations are summarized in FIGS. 7, 8, 9A and 9B.

Figure 7:
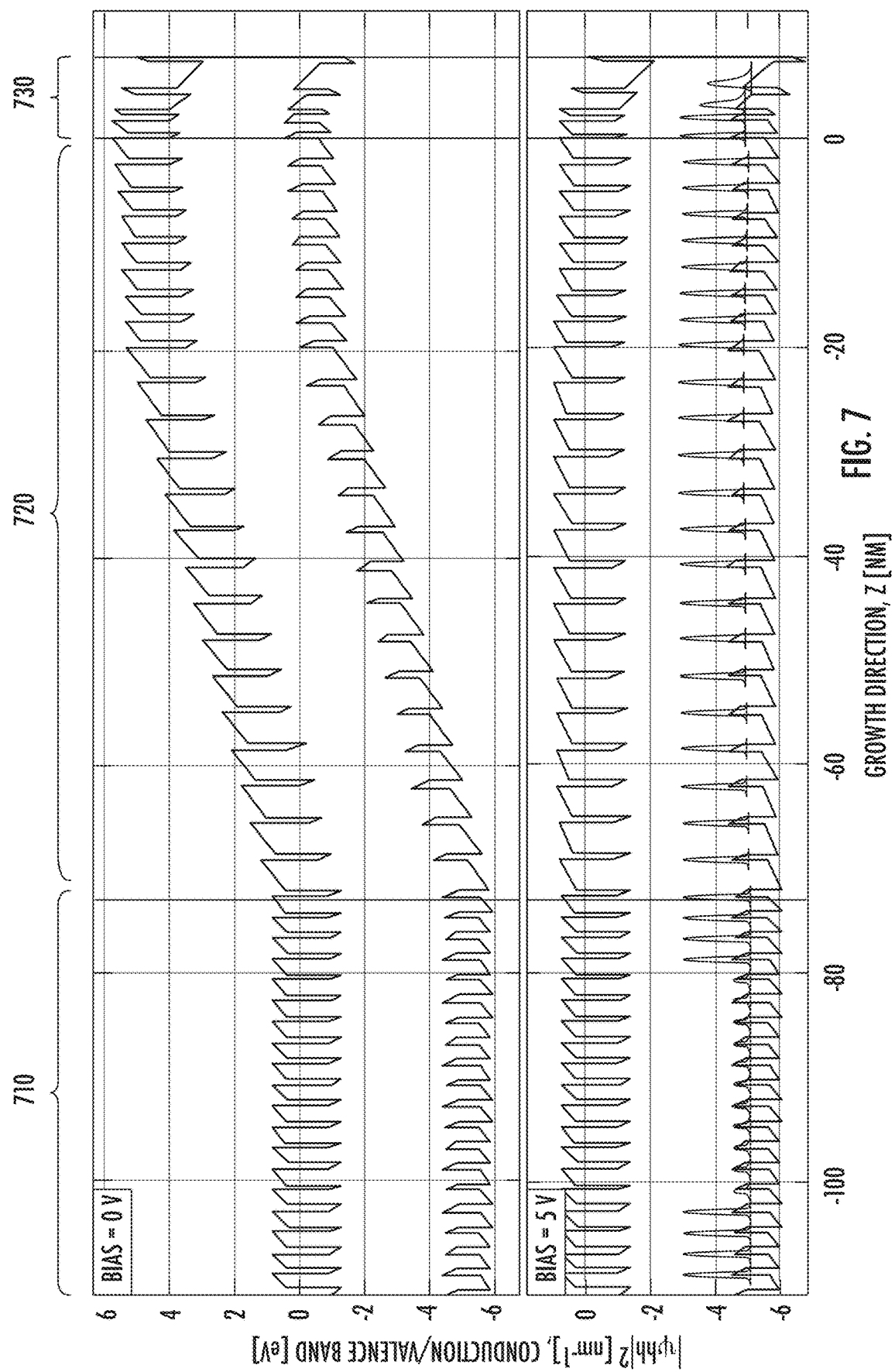
FIG. 7 shows 2 plots of simulations of the band structure of a semiconductor structure containing an ohmic-chirp layer, under two different biases applied to the metal contact, in accordance with some embodiments.

FIG. 7 shows simulations of the band structure of the LED device containing an ohmic-chirp layer structure as shown in FIGS. 5A-5B, for two different biases applied to the metal contact (adjacent to the ohmic-chirp layer 730), corresponding to zero bias and close to flat-band operation. Both panels show the conduction band at the Γ(k=0) point, and the heavy-hole band also at k=0. The bottom panel also shows the heavy-hole wavefunctions, whose individual baselines have been shifted to their respective energies for clarity. In this example, the n-SPSL layers 710 are n-doped with silicon at a concentration of $6\times10^{19}$ cm$^{-3}$, and the intrinsic SPSL layer 720 are unintentionally doped. The GaN wells in the last 8 nm of the ohmic-chirp layer 730 in this example have also been doped with $1.5\times10^{18}$ cm$^{-3}$ magnesium atoms. The flatness of valence band states within the ohmic-chirp layer region 730, even at zero-bias, along with their good alignment (e.g., less than 0.4 eV energy difference) with the contact Fermi level, provides low Schottky resistance and efficient hole doping.

Figure 8:
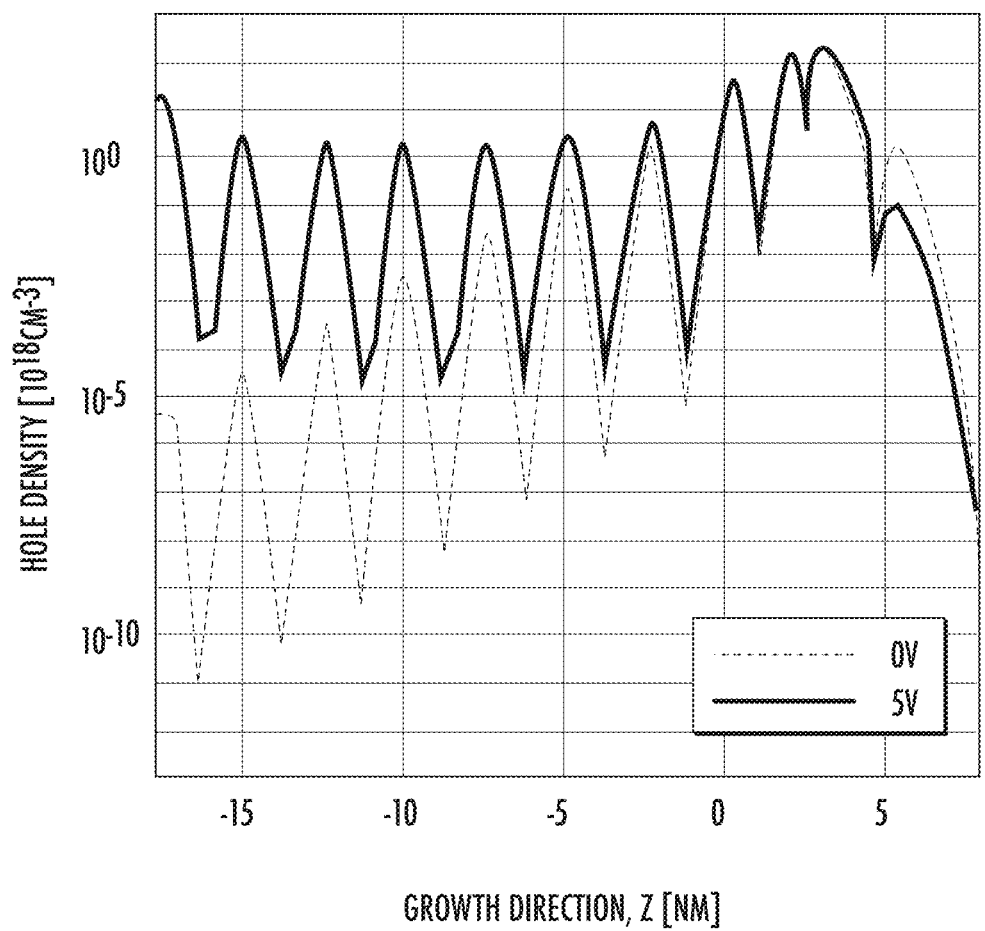
FIG. 8 is a plot of the simulated hole concentration, at the last 25 nm of the structure shown in FIG. 7, for two different applied biases, in accordance with some embodiments.

FIG. 8 shows a plot of the simulated hole concentration, at the last 25 nm (including the ohmic-chirp layer 730 and part of the intrinsic SPSL layer 720) of the device shown in FIG. 7, for two different applied biases (0 V and 5 V). The plot shows that a high hole concentration is present within the ohmic-chirp layer, and holes are efficiently transported into the intrinsic layer at a low LED operating voltage (i.e., at 5 V).

Figure 9A:
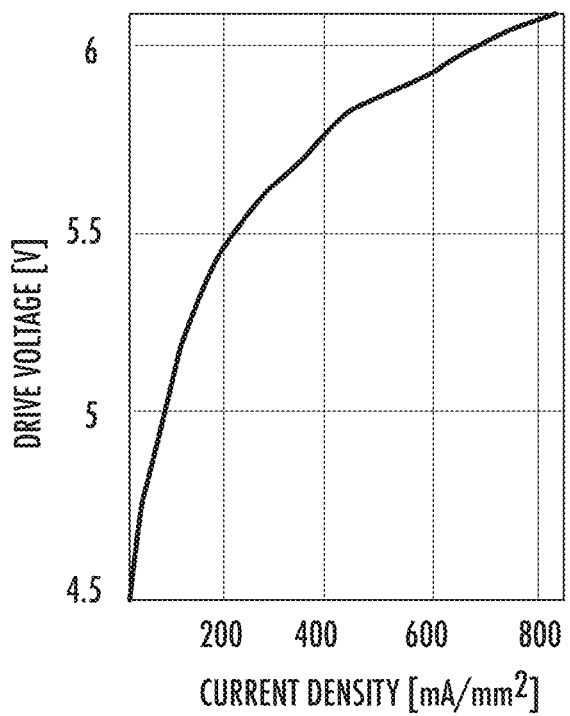
FIG. 9A is a plot of the simulated I-V curve for an LED, in accordance with some embodiments.
Figure 9B:
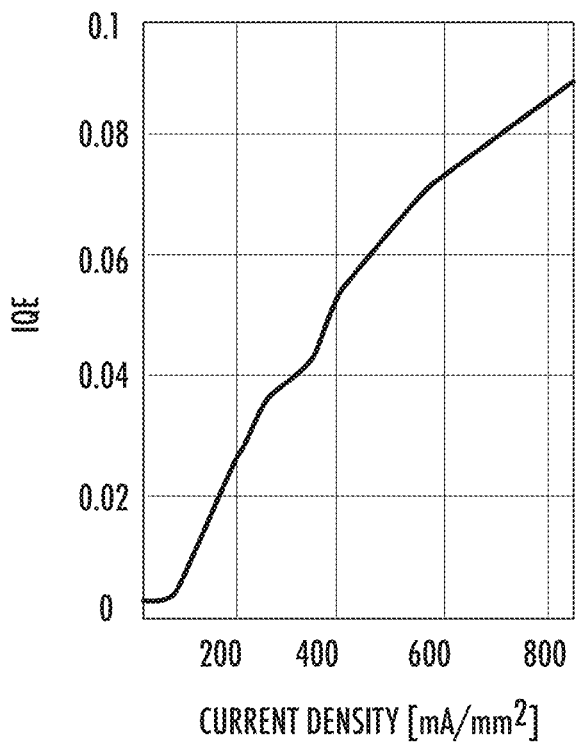
FIG. 9B is a plot of the internal quantum efficiency curve corresponding to the structure shown in FIG. 7, in accordance with some embodiments.

FIGS. 9A-9B show example results of plots of full transport simulations of the example structure shown in FIG. 7. FIG. 9A shows simulated I-V (i.e., current-voltage) curves, and FIG. 9B shows an internal quantum efficiency curve. The device reaches typical operating current densities (e.g., 400 mA/m$^2$) with a drive voltage as small as about 5.8 V (as shown in FIG. 9A), with an internal quantum efficiency from about 2% to about 10% (as shown in FIG. 9B). The small drive voltage in the simulations, 5.8 V, required to reach typical operating current densities (e.g., 400 mA/m$^2$) differs from the higher drive voltages (e.g., about 8.5 V) observed in experiments on devices with similar structures, which may be attributed to voltage losses not captured by the simulations, e.g., in n-sheet and n-contact Schottky resistance.

The examples above are non-limiting (e.g., the structures shown in FIGS. 5A and 7), and other embodiments of LEDs with ohmic-chirp layers are possible. In some cases, the device could include other structures and the device performance can be further improved. For example, the specific way the average aluminium content is graded within the ohmic-chirp layer can be changed to affect the device performance, as shown in FIGS. 10A-10B.

Figure 10A:
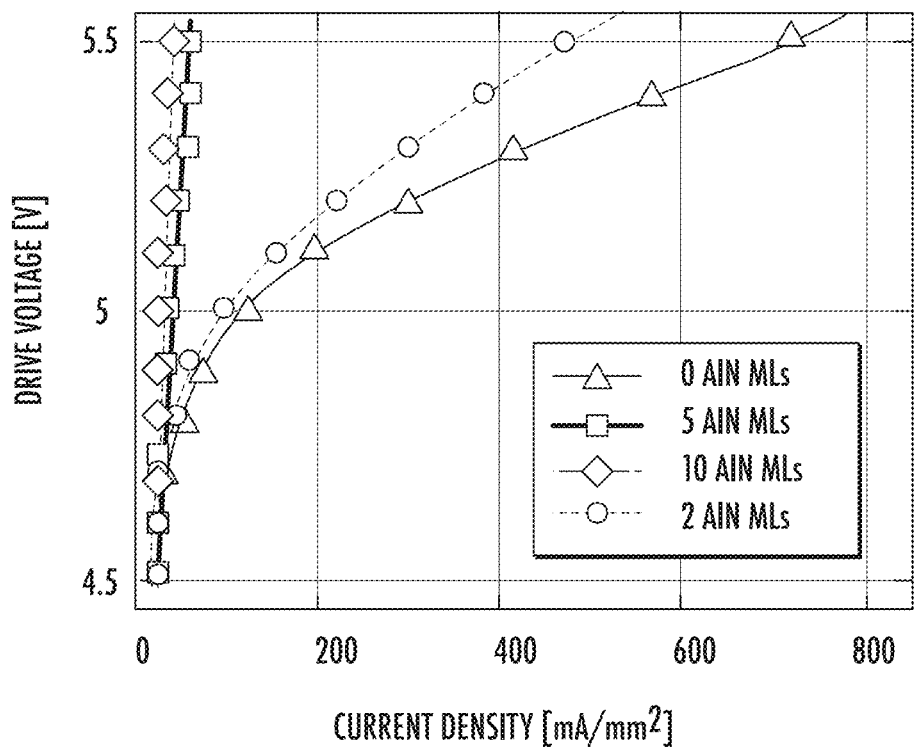
FIG. 10A is a plot of I-V curves for an LED for different last AlN barrier thicknesses, in accordance with some embodiments.
Figure 10B:
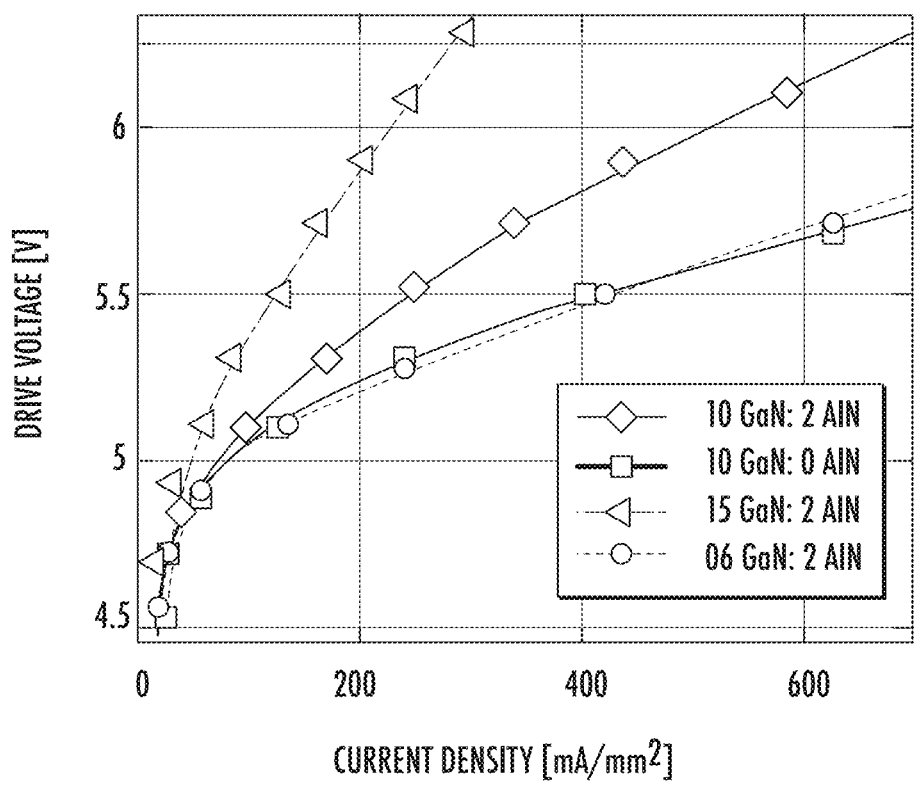
FIG. 10B is a plot of I-V curves for an LED for different last GaN well thickness, in accordance with some embodiments.

FIGS. 10A-10B show example simulations that show the influence of the last SPSL period composition on the simulated transport performances of device architectures with different ohmic chirp layers. Four curves are shown in the figure. "0 AlN MLs" is a simulation of a device with an ohmic-chirp layer ending in a 0 ML AlN barrier cap adjacent to the contact. "2 AlN MLs" is a simulation of a device with an ohmic-chirp layer ending in a 2 ML AlN barrier cap adjacent to the contact. "5 AlN MLs" is a simulation of a device with an ohmic-chirp layer ending in a 5 ML AlN barrier cap adjacent to the contact. "10 AlN MLs" is a simulation of a device with an ohmic-chirp layer ending in a 10 ML AlN barrier cap adjacent to the contact. FIG. 10A shows the influence of the last AlN barrier thickness (i.e., of the barrier closest to the metal contact), while FIG. 10B shows the influence of the last GaN well thickness (i.e., of the well closest to the metal contact). FIG. 10A shows the I-V performance of similar LEDs with ohmic-chirp layer structures terminated with an AlN layer (i.e., where the last layer of the ohmic-chirp layer before the metal contact is AlN) whose thickness varies from 0 ML (i.e., the device terminates with GaN) to 10 MLs. The device performance for the "2 AlN MLs" capping layer is slightly worse than that of the device with no cap, but the performance significantly degrades as the capping layer thickness is increased from "2 AlN MLs" to "5 AlN MLs". Not to be limited by theory, two effects could be contributing to the performance degradation. First, thicker capping layers cause higher initial aluminium content, and therefore a smaller beneficial effect of the spontaneous polarization field reducing the width of the contact depletion region next to the metal contact. Second, the thicker the AlN barrier adjacent to the metal contact, the harder it is for holes to tunnel through it, which effectively increases the contact resistance. While terminating with GaN is desirable to achieve the lowest Schottky resistance, it can be challenging to control the exact thickness of a thin GaN layer on top of an epitaxially grown device. Therefore, capping the device growth with a thin AlN layer, which is much more stable to desorption than a GaN layer (e.g., for temperatures from 600° C. to 800° C. under vacuum, after the growth is complete but before the layer cools), can be beneficial to better control the exact ohmic-chirp layer composition. In some embodiments, the ohmic-chirp layer is capped with a thin (e.g., less than 5 MLs, or less than 2 MLs) AlN layer, and the overall device performance is only slightly degraded, or not degraded compared to a similar device with an ohmic-chirp layer with no AlN cap.

Furthermore, in some embodiments, the last GaN well thickness also plays a crucial role in reducing the operating voltage, as shown in FIG. 10B. While a thick well means a low aluminium content, which is beneficial, making it too thick can increase the contact resistance. Four curves are shown in the figure. "10 GaN:2 AlN" is a simulation of a device with an ohmic-chirp layer ending in a 10 ML GaN well and a 2 ML AlN barrier cap adjacent to the contact. "10 GaN:0 AlN" is a simulation of a device with an ohmic-chirp layer ending in a 10 ML GaN well and no AlN barrier cap adjacent to the contact. "15 GaN:2 AlN" is a simulation of a device with an ohmic-chirp layer ending in a 15 ML GaN well and a 2 ML AlN barrier cap adjacent to the contact. "06 GaN:2 AlN" is a simulation of a device with an ohmic-chirp layer ending in a 10 ML GaN well and a 2 ML AlN barrier cap adjacent to the contact. Not to be limited by theory, this can be due to two reasons. First, making the last well too thick reduces the aluminium grading next to the contact, which reduces the spontaneous polarization field (e.g., as in the last chirp period in FIG. 5B). Second, due to band bending, a thicker well has a hole ground state located at a greater distance away from the contact, which makes hole tunnelling more difficult. Therefore, one possible improvement to the device structure shown in FIGS. 5A-5B is to end the ohmic-chirp layer with a GaN well that is less than or equal to 6 MLs, or less than 10 MLs. Alternatively, the device structure shown in FIGS. 5A-5B could be improved by removing the last superlattice period, if that period has a thick well. This has an added benefit of reducing the thickness of the thin absorption layers, which could then increase light extraction efficiency.

In some embodiments, a steep grading close to the metal interface (e.g., in the ohmic-chirp layers described herein) reduces the contact resistance for an ohmic contact in UV LEDs based on AlN, GaN and/or AlGaN materials. Not to be limited by theory, the steep gradient can reduce the depletion width in the device layer adjacent to the metal contact due to the resulting spontaneous polarization field. Therefore, simply capping a p-doped AlGaN region with a thick p-doped GaN region (e.g., greater than 5 nm, or from 5 nm to 200 nm, or from 30 nm to 50 nm), as is sometimes conventionally done, has a much weaker benefit to the contact resistance compared to the much stronger effect provided by the ohmic-chirp layers described herein.

Figures 11, 12:
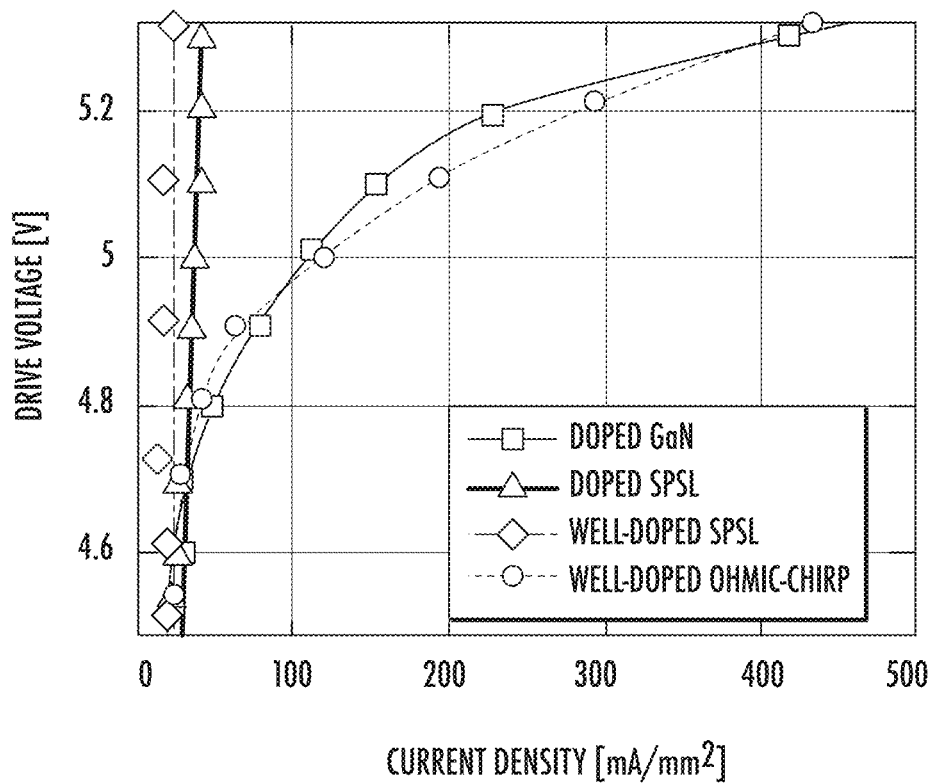
FIG. 11 is a plot of I-V curves for an LED for different p-doped materials, in accordance with some embodiments.
FIG. 12 shows complex refractive index, reflectivity and reflection phase, at 265 nm wavelength, for different interfaces between AlGaN and various metals, in accordance with some embodiments.

FIG. 11 shows simulation examples showing the beneficial performance of an ohmic-chirp based architecture by comparing its I-V performance ("well-doped ohmic-chirp") to simulated structures with different p-doped materials, including a thick p-GaN structure ("doped GaN"), and two high aluminium-composition SPSLs that do not chirp down to low aluminium composition in the few last periods ("doped SPSL" and "well-doped SPSL"). The simulated structures "doped SPSL" contain p-doping in the wells and barrier, while the "well-doped SPSL" and "well-doped ohmic-chirp" contain p-doping in the wells only. The benefit of the gradient within the ohmic-chirp layers is clearly seen in FIG. 11, as illustrated by the increase in current density achieved for a given drive voltage compared to those of the "doped SPSL" and "well-doped SPSL" structures. A similar trend has also been observed in experimentally grown LED devices with and without ohmic-chirp layers. In previous experiments, wafers used a p-doped SPSL with a constant period composition containing 2 MLs of GaN and 2 MLs of AlN adjacent to a metal p-contact. Those devices performed poorly, with operating voltages beyond 12 V and low IQEs. Also, as observed in experiments, the structures containing ohmic-chirp layers have transport performance that is quite similar to the performance of traditional structures containing thick p-GaN layers (e.g., greater than 5 nm, or from 5 nm to 200 nm, or from 30 nm to 50 nm).

Figure 13A:
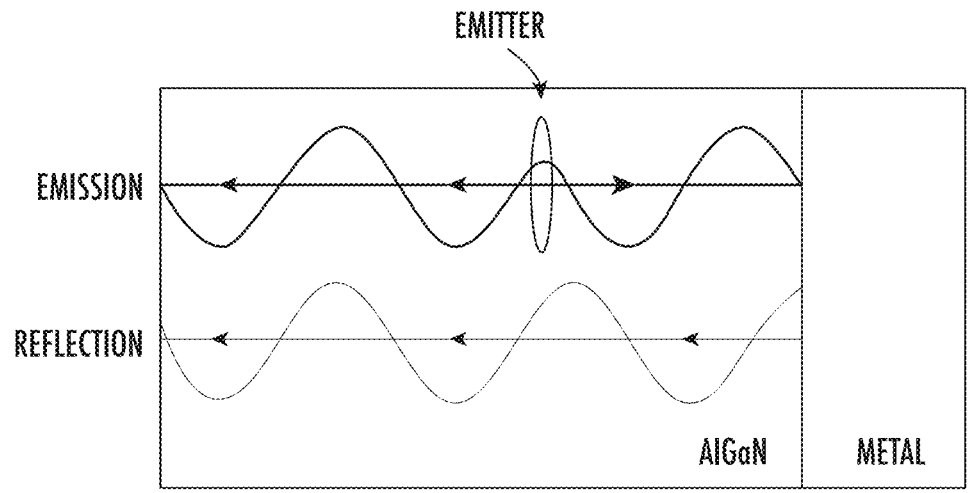
FIG. 13A is a schematic representation of emitted and reflected waves in an LED, in accordance with some embodiments.
Figure 13B:
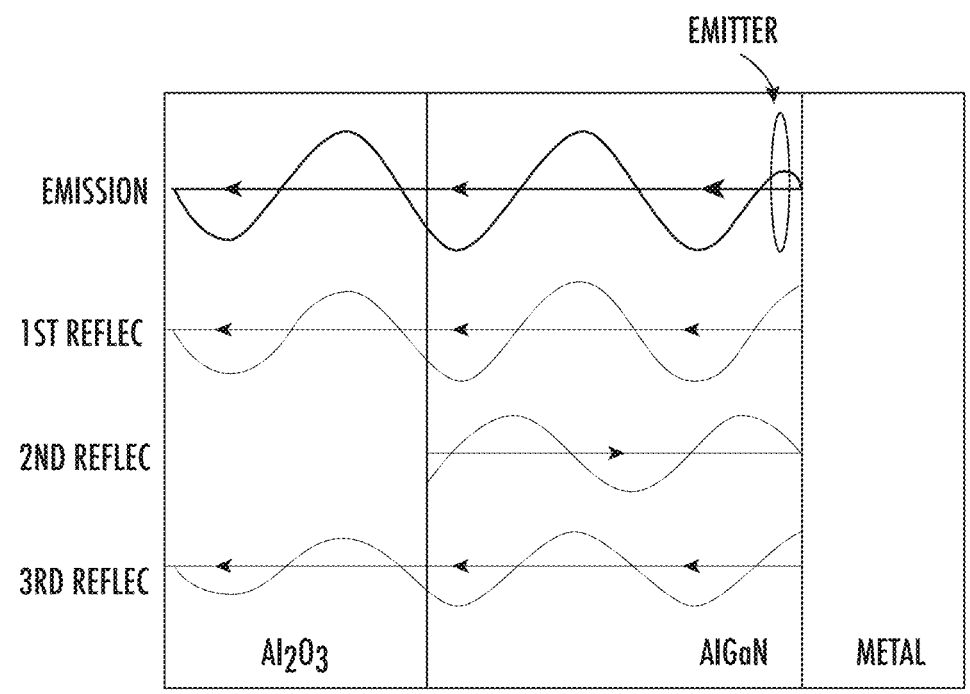
FIG. 13B is a schematic representation of emitted and reflected waves in an LED, in accordance with some embodiments.

FIGS. 12, 13A and 13B show examples of light extraction optimization via selection of metal contact materials and emitter positioning in LEDs. FIG. 12 shows the complex refractive index of an AlGaN layer (m) and the metal contact layer ($n_2$), and the reflectivity (R) and reflection phase (Phase) at 265 nm wavelength, for different example interfaces between AlGaN and a metal contact. FIG. 13A shows an example schematic representation of emitted and reflected waves, where the emitter is placed $9\lambda/8n=117$ nm (where $\lambda$ is the radiation wavelength outside the emission material, AlGaN in this case, and n is the refractive index of the emission material) away from the metal interface, which generates constructive interference of light in the left direction (i.e., the direction of the light extraction), as shown by FIG. 13A.

Using a transparent p-material in LEDs increases the need to control the light that is emitted in the direction of the p-material. In some embodiments of the LED structures and devices described herein, the light is emitted through the substrate (e.g., sapphire) side, and therefore it is beneficial to reflect the light emitted in the opposite direction (i.e., in the direction of the p-material) as efficiently as possible. In some embodiments, the metal contact is itself reflective, and choosing an optimally reflective metal is advantageous. Given two interfaces within a structure, the amplitude and phase of a reflected wave can be approximated by using the complex refractive indices of the materials within the structure. In FIG. 12 four examples of metal/AlGaN interfaces are shown. Using aluminium as a contact to a p-type AlGaN material in the "AlGaN/Al" case has the clear advantage that it reflects most of the incident light with a 265 nm wavelength (i.e., R in this case is approximately 89%). While this presents a clear advantage in efficiently extracting the emitted light though the substrate (e.g., sapphire) side, it is advantageous for the emitted and reflected light to interfere constructively in that direction as well. Indeed, since in some embodiments the emission linewidths are below 20 nm (i.e., less than 10% of the emission wavelength), one can assume good phase coherence with distances on the order of $10\times\lambda_{AlGaN}\approx1$ micron (where $\lambda_{AlGaN}$ is the wavelength of light within the AlGaN material), which is much larger than the distances between the emitter and contact in conventional structures (e.g., around 50 nm). The interference between emitted and reflected waves is depicted in FIG. 13A for a $-90°$ reflected phase difference. Therefore, in this case, destructive interference happens if the emitter is $3\lambda/8n=39$ nm, or $7\lambda/8n=91$ nm (or $3\lambda/8n+m\lambda/2n$, where m is an integer and n the cavity's refractive index), away from the metal, and therefore structures with emitters placed at those distances should be avoided. On the other hand, constructive interference happens if the emitter is $\lambda/8n=13$ nm, or $5\lambda/8n=65$ nm (or $\lambda/8n+m\lambda/2n$, where m is an integer and n the cavity's refractive index), away from the metal, and therefore structures with emitters placed at those distances are beneficial.

In general, the LED substrate material has a very different refractive index than the active layers. For example, sapphire ($Al_2O_3$) has a n≈1.8 at 265 nm, which causes a R≈2% reflectance between the sapphire substrate and the AlGaN active layers. Even though this number looks negligible, the amplitude reflection coefficient r ($R=|r|^2$) is not so, r≈14%. As a consequence, one has to consider multiple reflections between the p-metal contact mirror and the AlGaN/Sapphire interface to understand the optical modes allowed inside the LED structure, which will impact the total light extracted from the LED.

FIG. 13B schematically shows an LED structure on a sapphire ($Al_2O_3$) substrate. In this example, the emitter is placed at a distance $\lambda/8n$ from the metal contact. The light emitted to the right in the figure (i.e., towards the metal contact) is firstly reflected by the metal contact, and is in phase with the light emitted to the left in the figure (i.e., towards the sapphire) at the emitter location. This is equivalent to saying that the emitter sits at the optical mode antinode or, as said before, at a constructive interference location. The left-traveling waves henceforth are partially reflected at the interface with sapphire. For the example in FIG. 13B, that interface is $3\lambda/2n$ away from the emitter. At such a distance, the right-traveling reflected waves interfere constructively with the emitted waves at the emitter location. This corresponds to an allowed etalon-like cavity mode. It is therefore advantageous to place the emitter at the antinode of such a mode, and tailor the distance between substrate interface and metal mirror in such a way that the cavity mode wavelength matches the emission wavelength. For the sapphire/AlGaN/metal structure described in this example, this would correspond to the metal mirror being located a distance of $\lambda/8n+m\lambda/2n$, where m is an integer, away from the emitter, and the sapphire/AlGaN interface being located a distance $l\lambda/2n$, where l is an integer, away from the emitter. In this case, the emitter can benefit from a much higher optical density of states at a mode inside the light escape cone, and therefore an improvement in light extraction efficiency can be achieved. At the resonance wavelength, the ratio of the optical mode densities with ($\rho_{max}$) and without ($\rho_{1D}$) a cavity is: $\rho_{max}/\rho_{1D}=2(R_1R_2)^{3/4}/[1-(R_1R_2)]$. At the resonance wavelength, the directional emission enhancement out the exit mirror (i.e., the $Al_2O_3$ in this example), $G_e$, is simply given by the ratio of the optical mode densities multiplied by the fraction of the light exiting that mirror (i.e., $1-R_1$) divided by the average loss of the two mirrors for one round trip in the cavity (i.e., $[(1-R_1)+(1-R_2)]/2$), and $G_e=(\rho_{max}/\rho_{1D})*(1-R_1)/([(1-R_1)+(1-R_2)]/2)$.

Figure 14A:
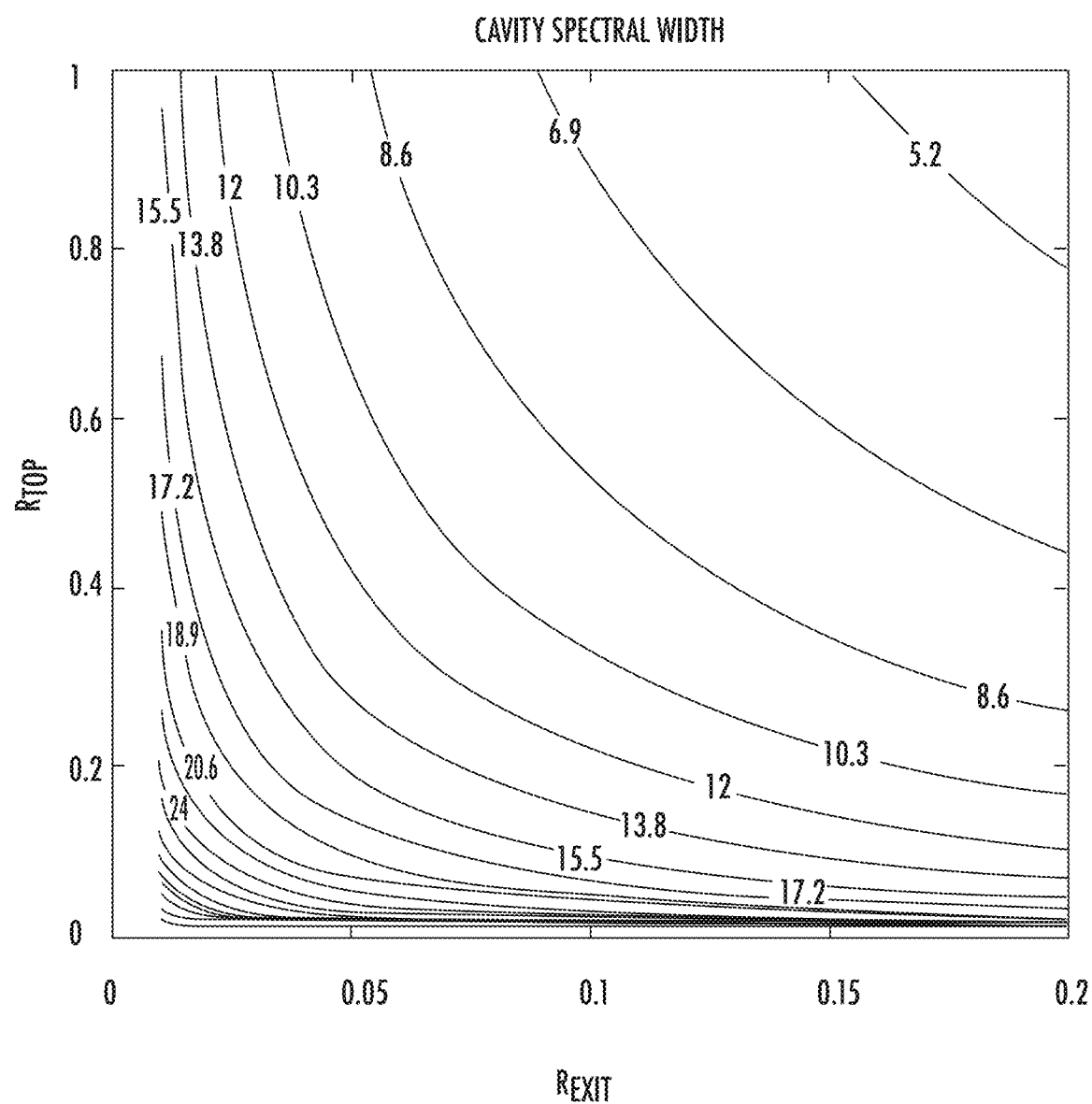
FIG. 14A is a plot of the calculated spectral width of a cavity LED structure, as a function of top and exit mirror reflectance, in accordance with some embodiments.

In some embodiments, it is important that the cavity resonance is wide enough to encompass a substantial part of the emission spectrum, and therefore a directional emission enhancement is achieved for all (or most of) the spectrum. In this way, the broadest possible light spectrum is efficiently extracted. For a Fabry-Perot resonator, the cavity resonance linewidth $\Delta\lambda$ (or cavity spectral width) can be estimated using $\Delta\lambda=\lambda^2 [1-(R_1R_2)^{1/2}]/[2\pi n L_{cav}(R_1R_2)^{1/4}]$, where $L_{cav}$ is the length of the cavity between two mirrors. FIG. 14A shows the calculated $\Delta\lambda$ for an 850 nm long cavity (i.e., $L_{cav}=850$ nm) with n=2.45. For a sapphire/AlGaN/metal structure, $0.3<R_2$ ($=R_{top}$, or the reflection at the metal contact/AlGaN interface)<0.9, and $R_1$ ($=R_{exit}$, or the reflection of the substrate/AlGaN interface) is small (e.g., less than 0.2), and therefore the cavity linewidth can be expected to be 12 nm$<\Delta\lambda<$20 nm. This is larger than the expect emission thermal width, $1.8 k_B T$ (where $k_B$ is the Boltzmann constant and T is the temperature), which is approximately 3 nm at 265 nm (even though the actual emission linewidth $\Delta\lambda_n$ is expected to be larger due to inhomogeneous broadening caused by disorder within the structure). Note that the intervals between the contours in FIG. 14A are equal (within a rounding error of +/−0.1) for all contours in the figure.

Figure 14B:
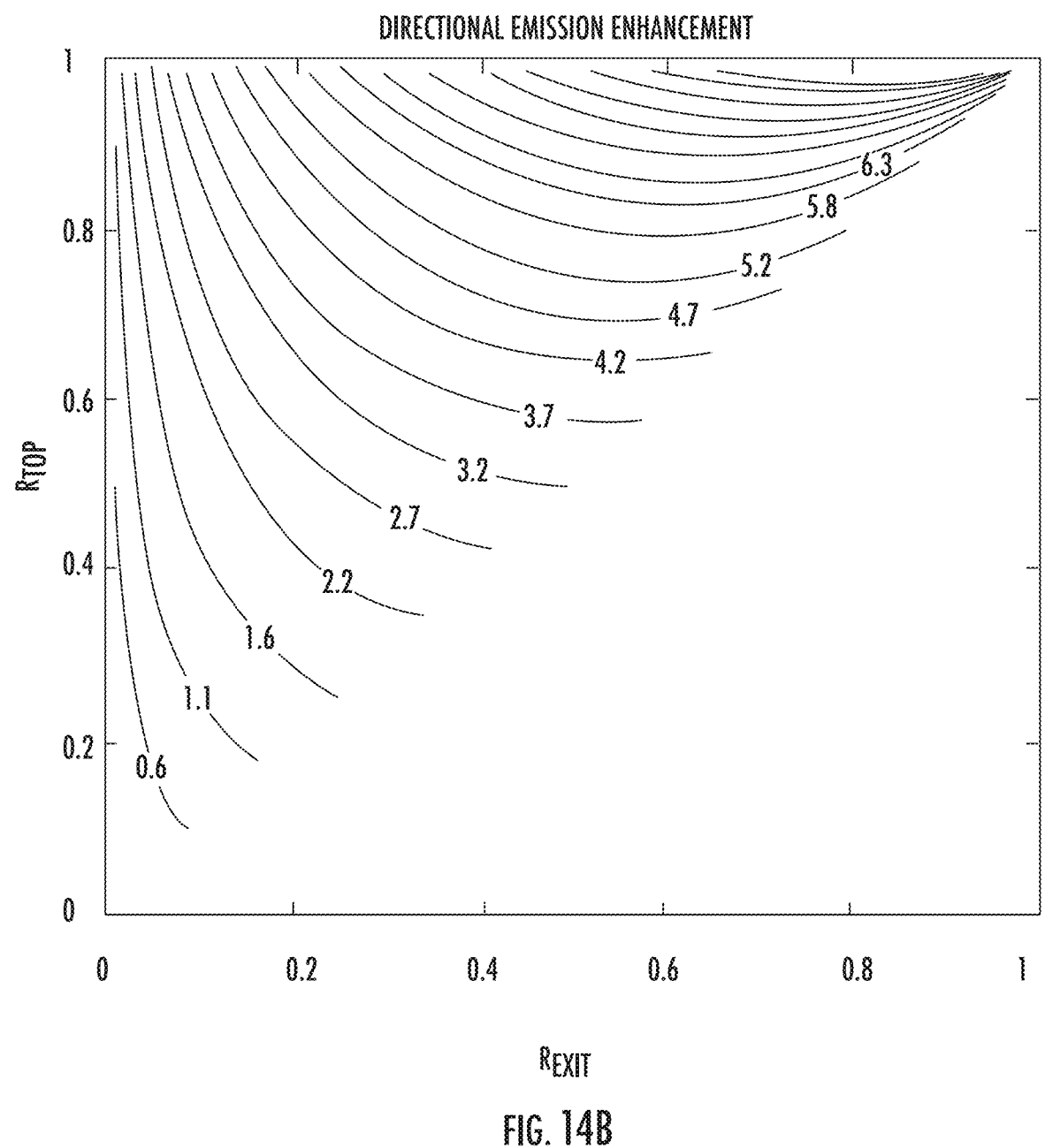
FIG. 14B is a plot of the calculated directional emission enhancement of a cavity LED structure, as a function of top and exit mirror reflectance, in accordance with some embodiments.

After integrating over the whole spectrum, the total directional emission enhancement can be simply estimated as $G_{int}=\xi[\pi \ln(2)]^{1/2}*(\Delta\lambda/\Delta\lambda_n)*G_e$, where is $\xi$ is the antinode enhancement factor, which we chose $\xi=2$ corresponding to the emitter being at an antinode. FIG. 14B shows the calculated total directional emission enhancement, $G_{int}$, for the cavity structure simulated in FIG. 14A. We have assumed $\Delta\lambda_n=5$ nm, and $R_{exit}=R_1<R_2$. The total directional emission enhancement $G_{int}$ can be from about 2 to 10, or from about 2 to 5, or from about 1 to about 10, as shown in FIG. 14B. Note that the intervals between the contours in FIG. 14B are equal (within a rounding error of +/−0.1) for all contours in the figure.

It is clear from FIG. 14B that, for an AlGaN-on-sapphire LED ($R_1=2$%), an enhancement in the vertical emission is only achieved if $R_2$ is greater than about 60%. Therefore, in such an example, out of the metals shown in FIG. 12, aluminium is the most beneficial to achieve a cavity enhancement in light extraction.

Figure 15A:
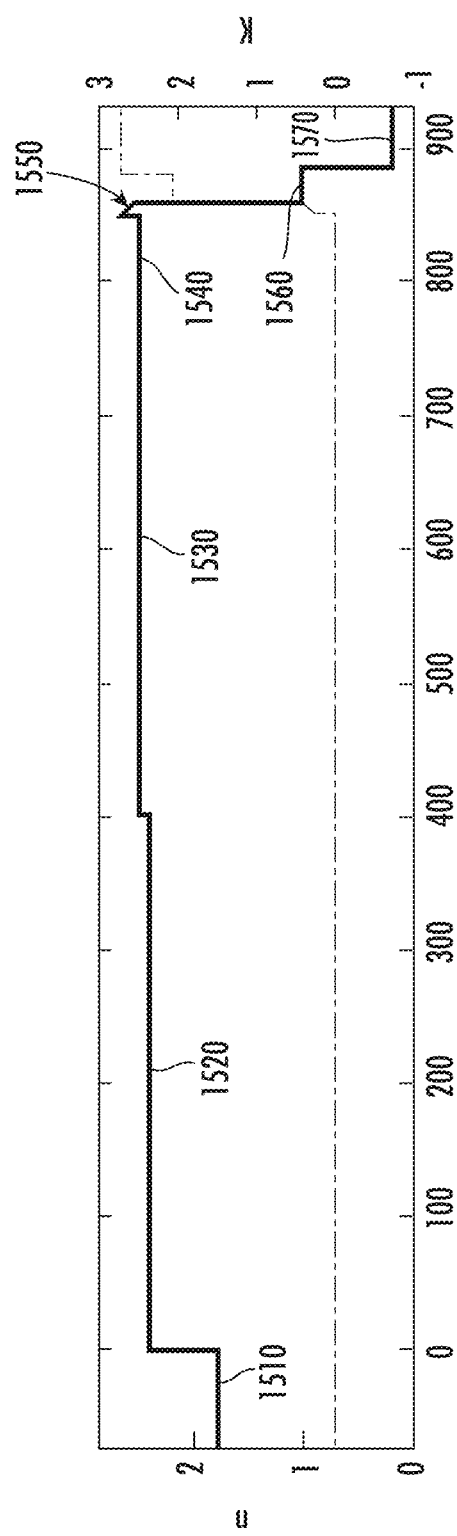
FIG. 15A is a plot of the calculated real (n) and imaginary (k) components of the refractive index of epitaxial layers in an LED, in accordance with some embodiments.

FIG. 15A schematically shows the simulated real n (solid line) and imaginary k (dashed line) parts of the refractive index, calculated at a wavelength $\lambda=266$ nm, for layers in a cavity LED structure including those for a sapphire ($Al_2O_3$) substrate 1510, 400 nm of AlN buffer layer 1520, 380 nm of n-doped SPSL layer 1530, 68 nm of unintentionally doped SPSL layer 1540 (with same refractive index as n-SPSL), 8 nm of p-doped ohmic-chirp layer 1550, and 25 nm of titanium metal contact 1560 cover by aluminium 1570. The last few nanometers of the ohmic-chirp layer are somewhat absorptive (k>0). Neglecting the small refractive index changes within the AlN/SPSL/chirp structure, the most important optical reflections occur at the bottom interface with sapphire (i.e., between layer 1520 and substrate 1510) and at the top interface with titanium (i.e., between layers 1550 and 1560). The structure shown in FIG. 15A, therefore, contains an 856 nm long cavity.

Figure 15B:
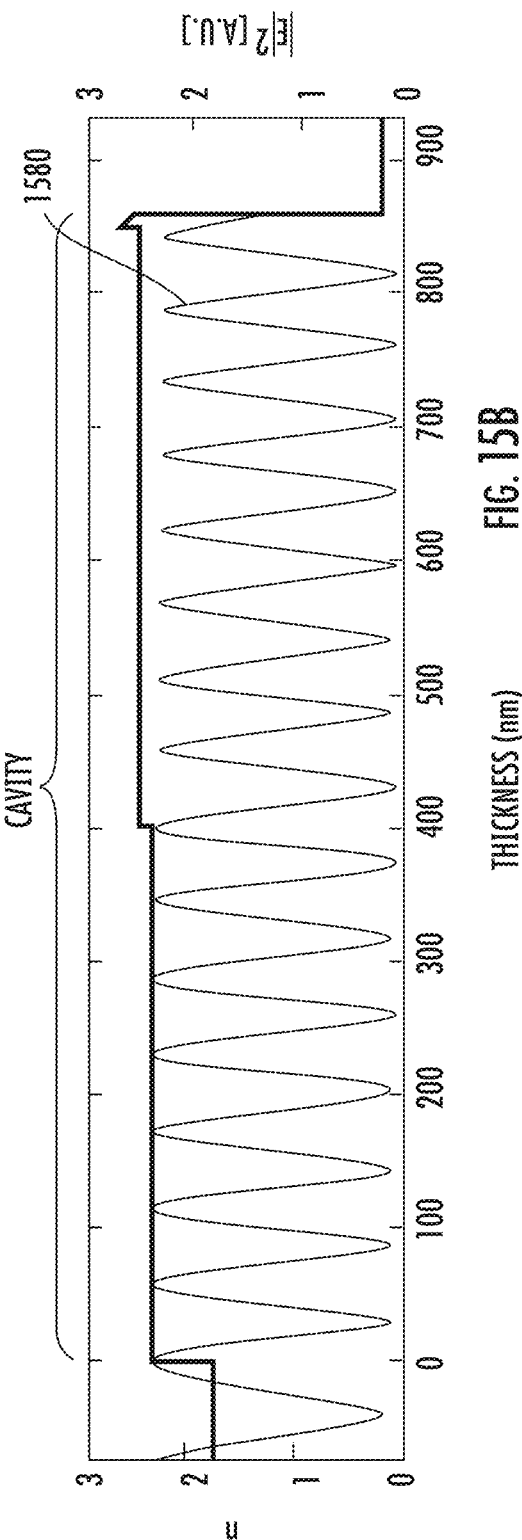
FIG. 15B is a plot of the calculated real (n) component of the refractive index, of epitaxial layers in an LED, and of the electric field squared amplitude of a UV light reflected by such those layers, in accordance with some embodiments.

FIG. 15B schematically shows the simulated real n (solid line) part of the refractive index, calculated at a wavelength $\lambda=266$ nm, for a cavity LED structure similar to the one in FIG. 15A, with the only difference being the absence of the 25 nm titanium contact layer 1560. The squared electric field amplitude 1580, for a $\lambda=266$ nm mode impinging from the sapphire side, is also shown. For that wavelength, the total cavity length is $15\lambda/2n+\lambda/8n$, which corresponds to a cavity resonance mode as per the previous discussion.

Figure 16A:
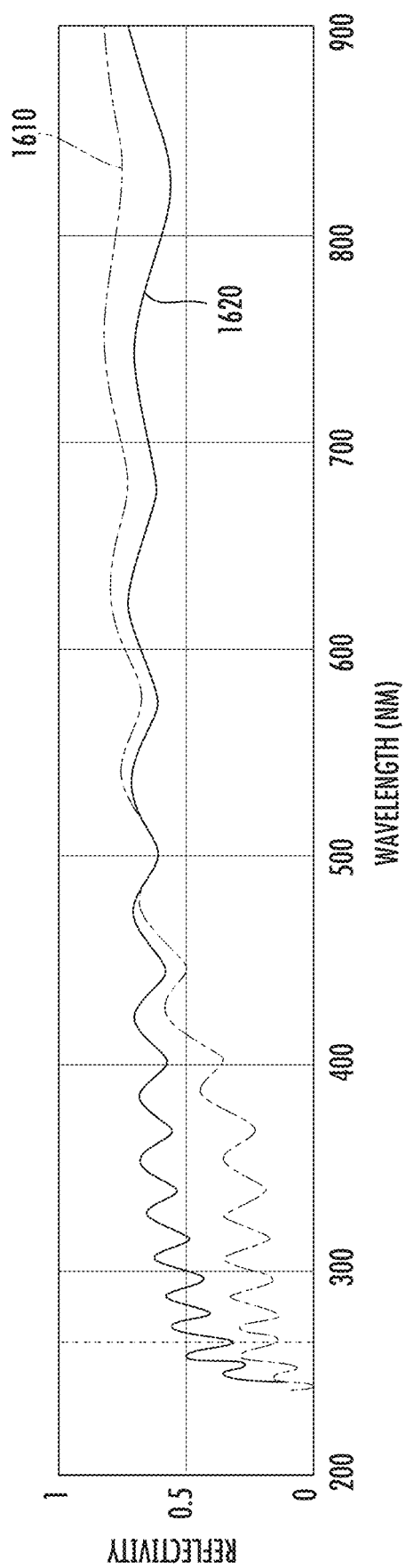
FIG. 16A is a plot of the calculated reflectivity spectrum of LED structures, in accordance with some embodiments.

FIG. 16A shows the simulated reflectivity spectrum, probed from the sapphire side, of the structures shown in FIG. 15. The reflectivity of the structure shown in FIG. 15A (with Ti and Al) is simulated in curve 1610, and the reflectivity of the structure shown in FIG. 15B (with only Al) is simulated in curve 1620. The multiple peaks and valleys correspond to cavity modes with higher densities of states, which are beneficial for light extraction as discussed above. The vertical dashed line corresponds to $\lambda=266$ nm, which is the wavelength used for simulations in FIGS. 15A and 15B.

Figure 16B:
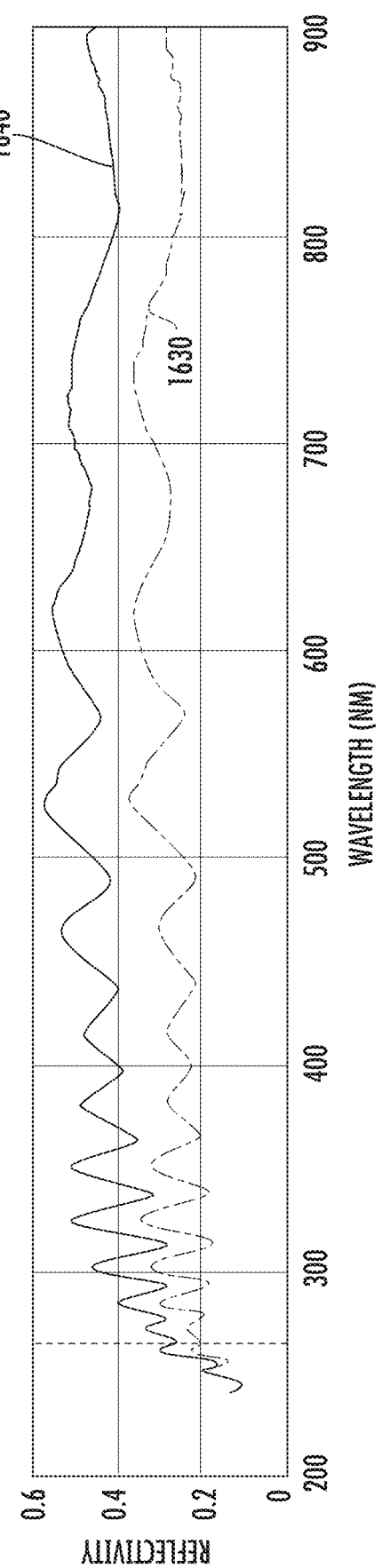
FIG. 16B is a plot of the measured reflectivity spectrum of LED structures, in accordance with some embodiments.

FIG. 16B shows the measured reflectivity of two different example devices within the same wafer, therefore with a very similar epitaxial structure, the only difference being that one device had 25 nm Ti between an Al p-metal contact and the mesa epitaxial structure, while the other did not (the Al metal is in direct contact with the mesa epitaxial structure in this case). The measured reflectivity of the structure with a Ti/Al p-contact is shown in curve 1630, and the measured reflectivity of the structure with the Al p-contact is simulated is shown in curve 1640. The devices used to produce the example measurements shown in FIG. 16B had structures that were approximately the same as the structures simulated in FIGS. 15A and 15B. The reflectivity spectra also showed the typical cavity peaks and valleys, again with one at λ=266 nm. Even though in general terms FIG. 16B agrees with the simulations in FIG. 16A, some discrepancies are present due to experimental factors. For example, the reflectance measurements probed a wide device area that not only contained the mesa plus p-metal, but also regions where the top layers were etched away to for the n-metal contact. Even though these regions had a smaller area than the mesa, they did affect the total reflectivity spectra somewhat.

Figure 17A:
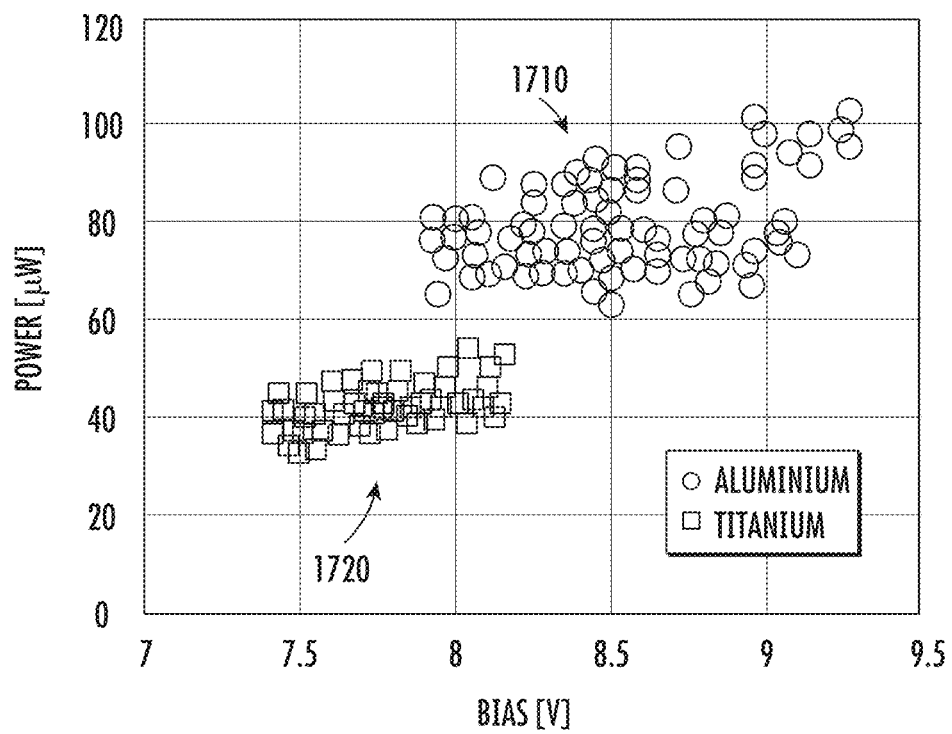
FIG. 17A is a plot of the measured output power of various LEDs, with indicated metal contact directly on top of p-doped mesas, in accordance with some embodiments.

FIG. 17A shows the output power of 366 example devices within the same wafer, whose epitaxial growth has been carried out to match the simulations in FIGS. 15A and 15B. 192 of these example devices have the aluminium p-metal in direct contact with the ohmic-chirp layer and have output power 1710, while the remaining 174 devices have a 25 nm thick titanium film in between the ohmic-chirp layer and the Al and have output power 1720. All devices have been biased to achieve a 10 mA drive current, which corresponds to varying current densities as the mesa areas vary between 8000 and 20000 μm². It is clear from the plot that the aluminium mirror improves output power by roughly a factor of 2 compared to a titanium mirror. This agrees with the expected improvement as discussed above (e.g., with respect to FIG. 14B). It is also noted in FIG. 17A that an extra ~0.7 V is needed to achieve the same current when using an aluminium mirror instead of a titanium mirror. This is at least partly because aluminium has a higher work function, and therefore a higher Schottky barrier, when compared to titanium. Overall, despite a slightly higher operating voltage, the devices with an aluminium contact have a much-improved wall plug efficiency.

Figure 17B:
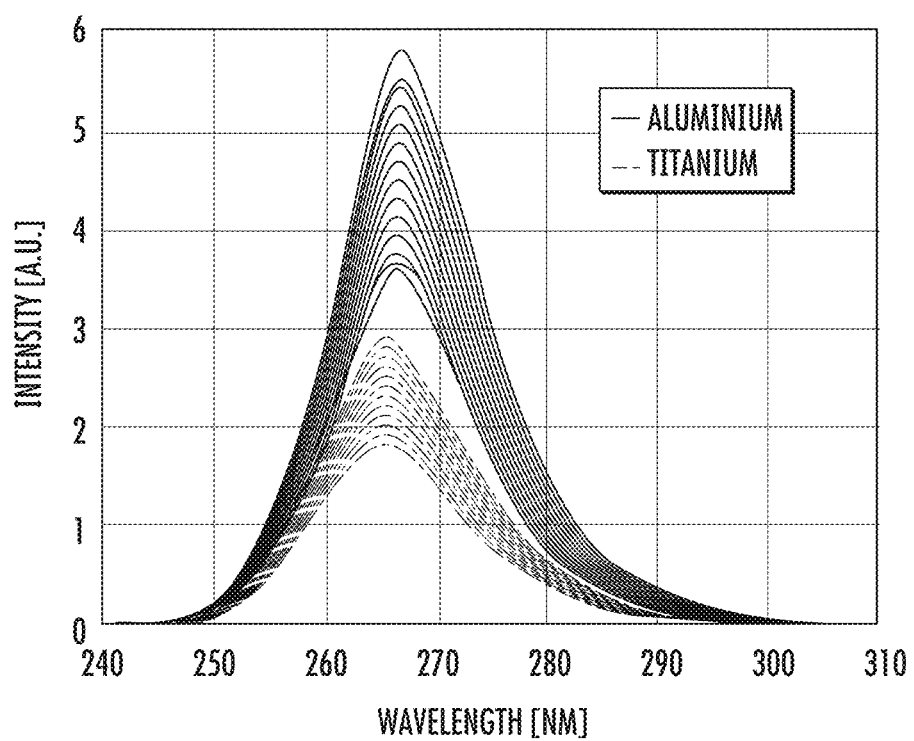
FIG. 17B is a plot of the measured emission spectrum of various LEDs, with indicated metal contact directly on top of p-doped mesas, in accordance with some embodiments.

As discussed previously, a directional emission enhancement is more prominent if the emitter is placed at the cavity antinode and if the emission wavelength overlaps with a cavity resonance. Given that, in the ohmic-chirp, the hole density is confined within the top few nanometers (e.g., as shown in FIG. 8), and since the holes are not expected to move much further inside the structure given their poor mobility, it is reasonable to assume that the optical emission measure in FIG. 17A indeed comes from the top-most antinode in FIG. 15B (i.e., between 832 and 848 nm, or between 8 and 24 nm away from the metal contact in these devices). As for the emission spectrum, FIG. 17B shows that all devices emit with a peak wavelength between 266 and 267 nm, which coincides with the cavity resonance.

Another consequence of the plot in FIG. 14B is that, in order to enhance the directional emission even further, one has to improve the bottom mirror (e.g., at the interface between the substrate and the cavity) reflectivity. This can only be done up to a maximum though, because if the bottom reflectivity is too high, then the emitted light will be strongly absorbed by, or lost through, the top mirror. Given that the reflectivity of the ohmic-chirp with an aluminium contact is around 70% (as described herein), the plot in FIG. 14B implies that directional emission can be further enhanced by using a bottom mirror reflectivity of up to about 50%, or 60%, or 70%, or a reflectivity that is less than the reflectivity of the ohmic-chirp (e.g., less than 70%, for an ohmic-chirp with an aluminium contact).

Figure 18A:
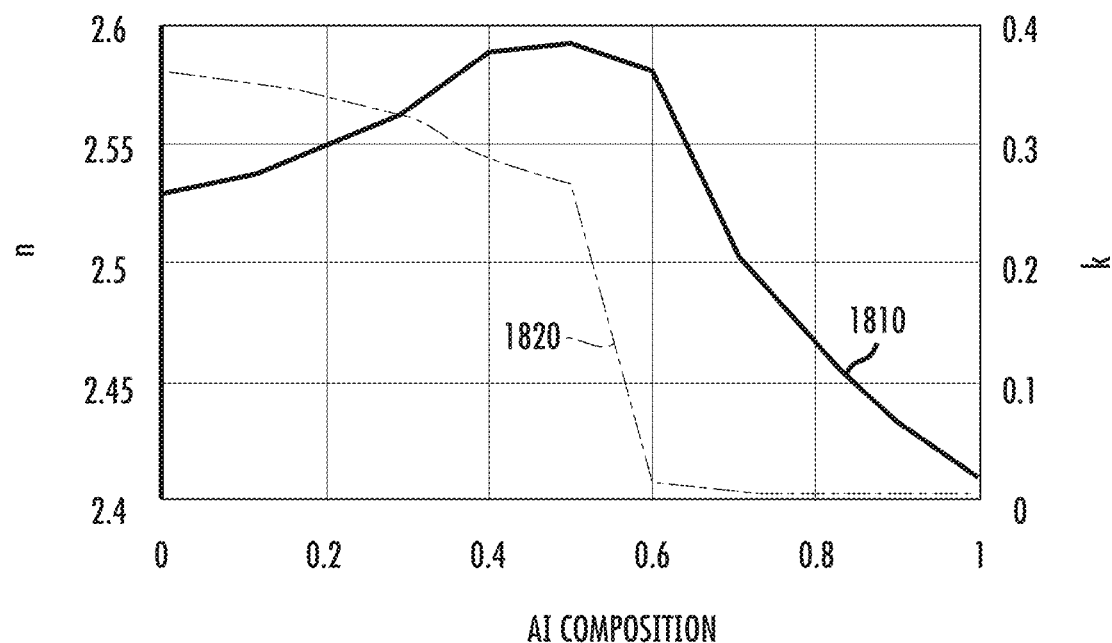
FIG. 18A is a plot of the calculated real (n) and imaginary (k) components of the refractive index of an AlGaN bulk material, as a function of the aluminium composition (x in $Al_xGa_{1-x}N$).

Given the epitaxial growth nature of the devices described herein, a possible way of introducing a bottom mirror is to periodically modulate the refractive index of AlGaN layers to achieve a reflective structure due to interference effects between the substrate and the cavity formed by the AlGaN layers (e.g., as shown in FIGS. 15A and 15B). Using AlGaN layers simplifies device fabrication (e.g., compared to flip-chip bonding followed by substrate removal and growth of a mirror structure) and/or avoids the introduction of extra crystal defects compared to using different epi-materials (i.e., different from the layers used in the rest of the structure) to form a bottom mirror. FIG. 18A shows the real 1810 ($n$) and imaginary 1820 ($k$) parts of the refractive index, at a wavelength λ=265 nm, of an AlGaN bulk material, as a function of its aluminium content (x in $Al_xGa_{1-x}N$). In this case, by changing x between 0.6 and 1, a refractive index contrast of up to 7% can be achieved while keeping the structure non-absorptive.

Figure 18B:
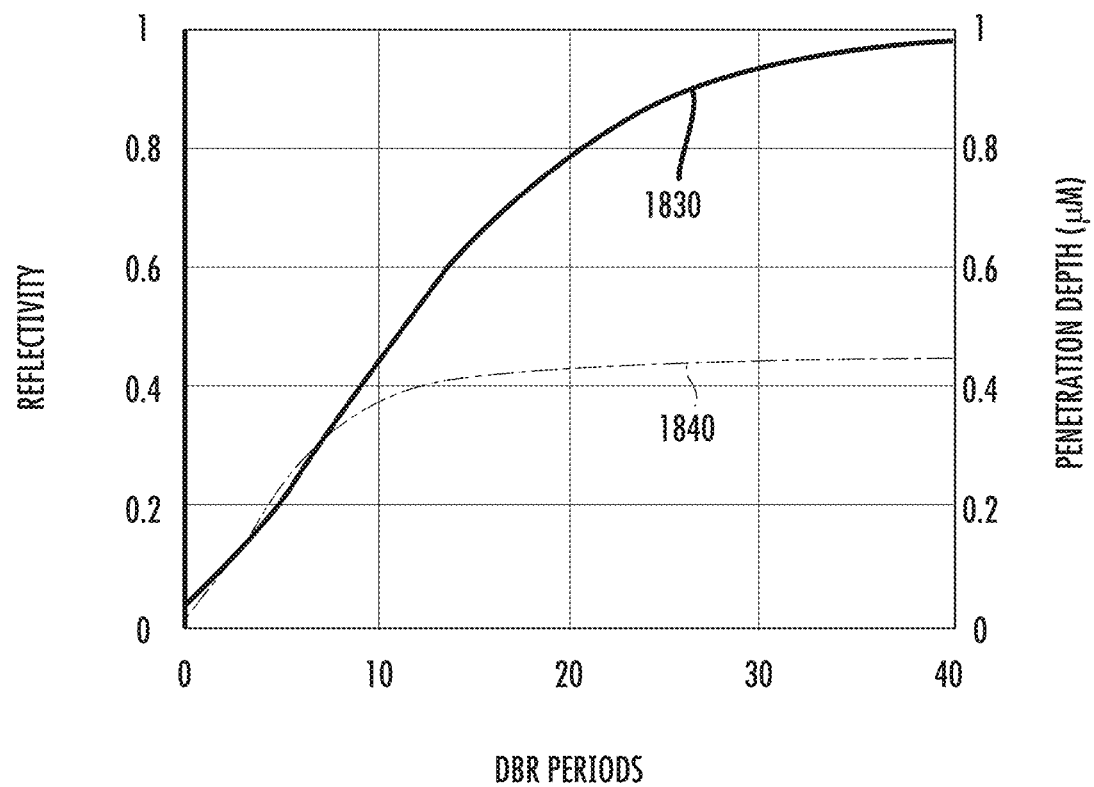
FIG. 18B is a plot of the reflectivity of, and mode penetration depth into, a distributed Bragg reflector (DBR), as a function of the latter's number of periods

An example of a reflective structure made from materials with engineered refractive index changes is a distributed Bragg reflector (DBR). A DBR consists of two different layers with different materials periodically alternated in such a way that their individual thicknesses equal λ/4, where λ is the desired wavelength around which the DBR is to be reflective. The two different layers in a DBR can contain binary, ternary, or quaternary semiconductors, or semiconductors with more than 4 elements, where the two different layers have different indices of refraction. FIG. 18B shows the total DBR reflectivity 1830, and field penetration depth 1840 into the DBR structure, as a function of the number of periods constituting the DBR. The refractive index of the two different DBR layers is assumed to be $n_1$=2.55 and $n_2$=2.4, which would roughly correspond to the maximum achievable contrast between AlGaN layers that are transparent at λ=265 nm, as per FIG. 18A. For example, taking 12 periods (total DBR thickness of 12λ/4*$[1/n_1+1/n_2]$=643 nm), a reflectivity of the DBR ($R_{DBR}$) is obtained, and $R_{DBR}$=53% with a 400 nm field penetration depth.

As previously discussed, the total directional emission enhancement $G_{int}$ is proportional to the cavity linewidth Δλ, which is inversely proportional to the cavity length $L_{cav}$. Therefore, in order to get the most benefit from the cavity over the widest emitted wavelength band, it is beneficial to bring the mirror as close as possible to the emitter. In some embodiments, therefore, it is beneficial to form the DBR as part of the n-doped layers in the diode structure (e.g., the structure shown in FIGS. 15A and 15B). This not only improves light extraction, but also reduce fabrication costs by avoiding the growth of extra epitaxial layers.

To achieve a DBR with good enough reflectivity made of ternary mix combinations of AlGaN, as discussed above, a strong variation in the aluminium composition is needed. This is not ideal, for several reasons. First, the strong strain variation across different layers can lead to crystal defects that can compromise device performance. Second, to get enough refractive index contrast between layers, high aluminium composition is needed. High aluminium composition AlGaN layers are known to be hard to n-dope, which would compromise lateral and, especially, vertical electron transport, leading to a number of problems including current crowding and low wall-plug efficiency. Third, the valence band mismatch between layers could cause electron trapping inside the lowest Al content layers, which would cause a high vertical resistance requiring the need for a high drive voltage. In some embodiments, the use of short-period superlattices (SPSLs) as constituents of each DBR layer can address all of the above problems. As discussed below, using a plurality of SPSLs to form a DBR can solve all the issues related to poor electron transport inside the DBR, while still allowing for sufficient refractive index contrast between layers. The materials in the SPSLs making up a DBR can contain binary, ternary, or quaternary semiconductors, or semiconductors with more than 4 elements, where the different materials provide different effective indices of refraction to the SPSL layers making up the DBR.

Figure 19A:
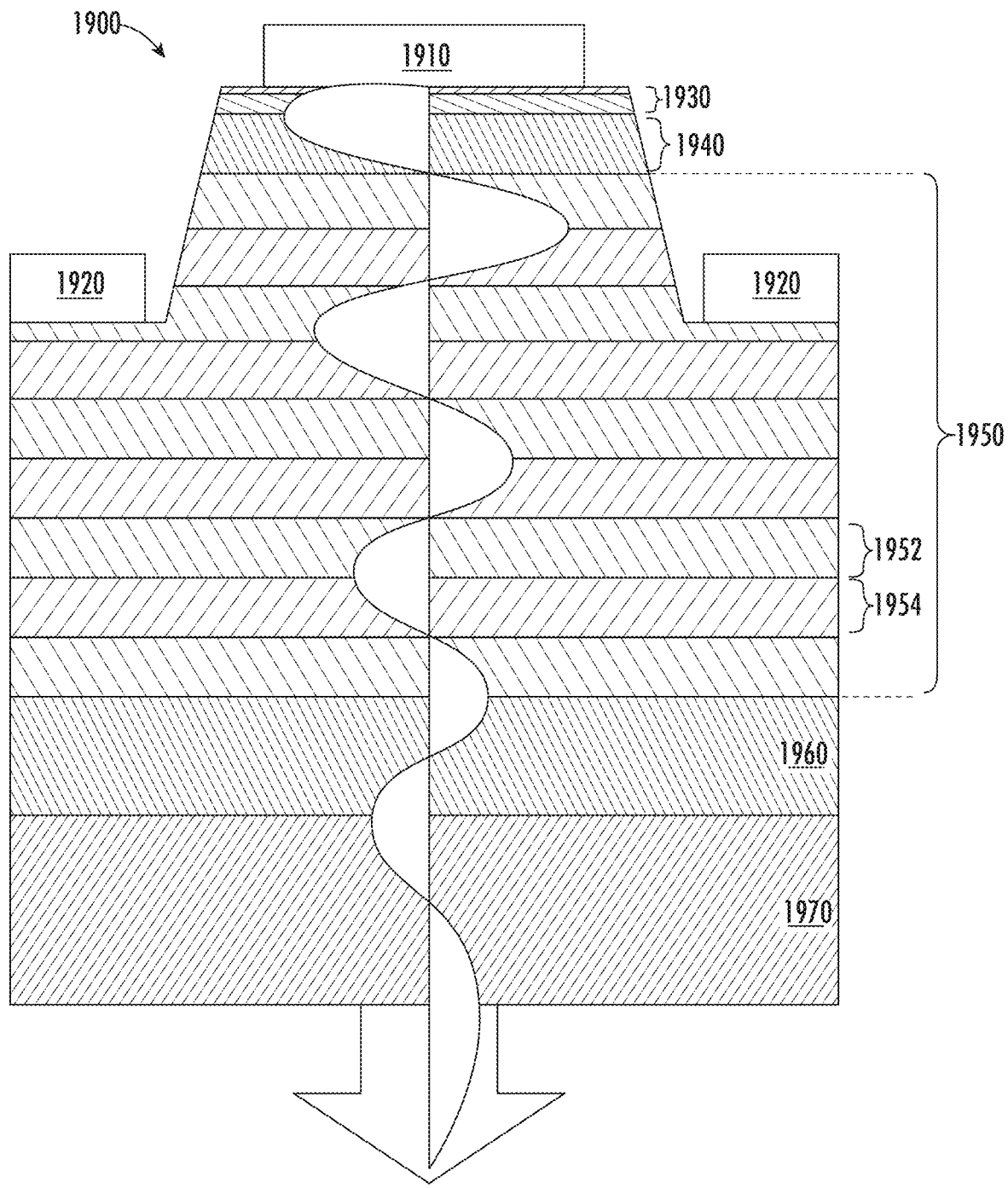
FIGS. 19A and 19B are simplified schematic representations of an example vertical cavity deep-UV LED structure, together with the electric field of the cavity mode.

FIG. 19A shows the schematic representation of a deep-UV vertical LED structure 1900. It consists of an AlN buffer 1960 grown on a sapphire substrate 1970, followed by an n-doped super-superlattice (n-SSL) 1950, an unintentionally doped material for light generation (i-layer) 1940, an ohmic-chirp 1930 serving as a p-doping material, and a metal reflector p-contact 1910. The term "super-superlattice (SSL)" as used herein describes a structure made up of repeating units, where the repeating units are two or more different superlattices. The AlN buffer 1960 thickness can be chosen to be a multiple of $\lambda/2n_{AlN}$ in order to improve the DBR reflectivity. The n-SSL 1950 layer can consist of many different materials, each of them containing an SPSL with total thickness equal to $\lambda/4n_i+m_i\lambda/2n_i$, where $n_i$ is the effective refractive index of each material and $m_i$ an integer number that can be different for each layer. Two such SPSLs 1952 and 1954 within the n-SSL are shown in FIG. 19A. For example, SPSL layer 1952 can have SPSL layer compositions and thicknesses to form a layer with a first effective refractive index, and SPSL layer 1954 can have different SPSL layer compositions and thicknesses to form a layer with a second effective refractive index. The DBR is then formed by repeating pairs of SPSL layers, like 1952 and 1954, throughout the n-SSL.

Continuing with FIG. 19A, the i-layer 1940 can contain an SPSL material whose bandgap matches the cavity resonance, and whose thickness is chosen such that the total cavity length between bottom and top reflectors yields a cavity resonance that is similar to the i-layer 1940 bandgap. The ohmic-chirp 1930 provides hole injection into the high-bandgap i-layer 1940 with a voltage penalty that is as low as possible, and is chosen to be as thin as possible to minimize light absorption. The top metal contact 1910 can be aluminium to provide maximal reflectivity. Additionally, a mesa structure is etched away to provide access into the n-SSL 1950 for contact with contacts 1920. Ideally the contacts 1920 contact a layer within the n-SSL 1950 to yield the smallest possible Schottky n-barrier. For example, this can be done by making contact with the lowest aluminium, or highest electron density, layers within the n-SSL layer. Alternatively, more precise etch stopping techniques can be used to reduce the Schottky barrier even further by using the polarization doping techniques described herein. For example, the structure can be grown metal-polar and have a very thin AlN layer between the n-contact and a lower Al content layer within the n-SSL material, which can reduce the contact resistance for the n-contact utilizing similar mechanisms as the ohmic-chirp structure described for hole injection at the p-contact.

Figure 19B:
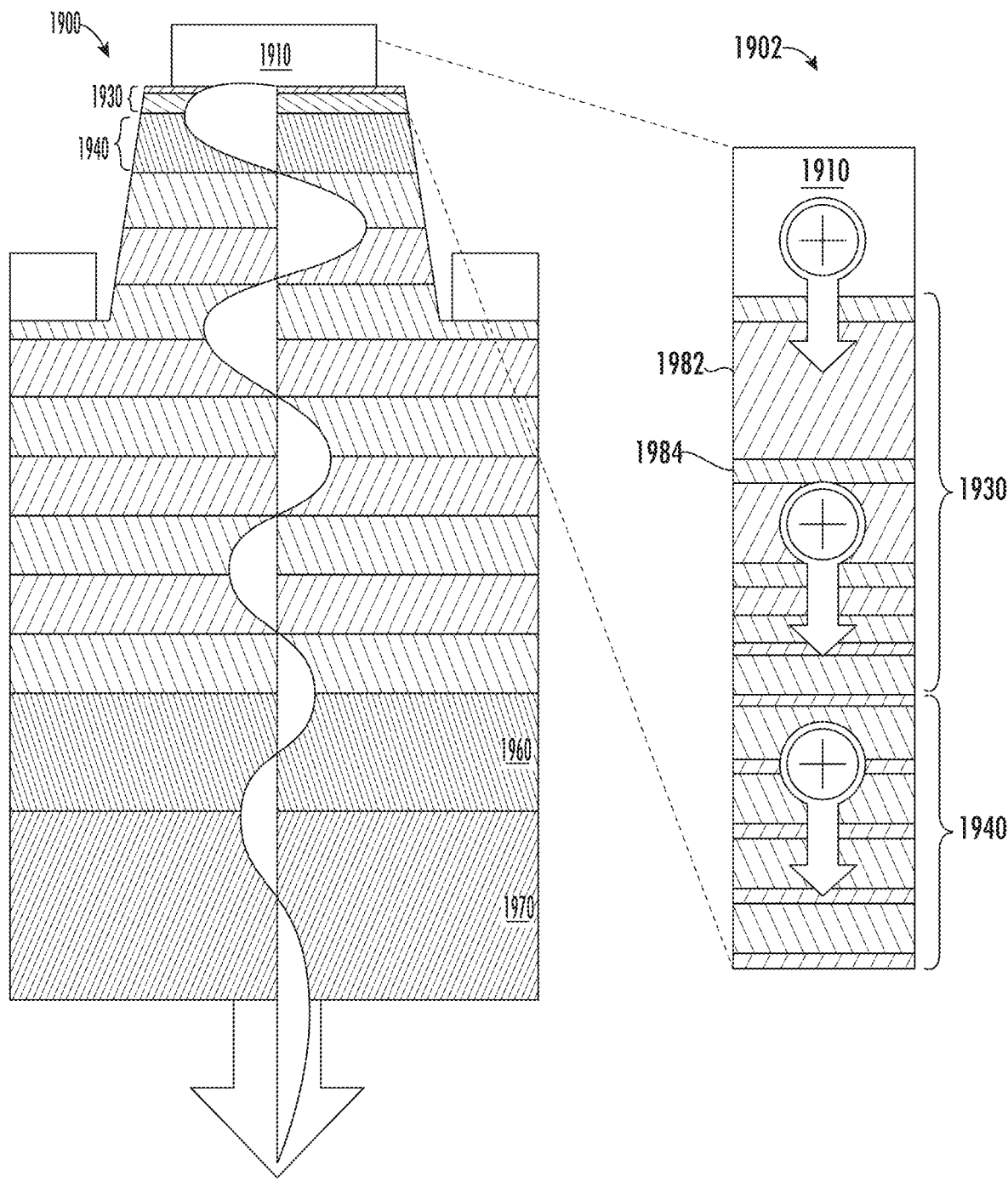

FIG. 19B shows the same structure 1900 shown in FIG. 19A, with an inset 1902 that shows a portion of the metal contact 1910, the ohmic-chirp layer 1930, and a portion of the unintentionally doped material for light generation (i-layer) 1940. The layers 1930 and 1940 in this example are SPSLs containing alternating layers of wider bandgap and narrower bandgap materials 1982 and 1984 (note that in different embodiments, material 1982 can be either the wider bandgap material or the narrower bandgap material, depending, for example, on the epi-growth polarity).

Figure 20:
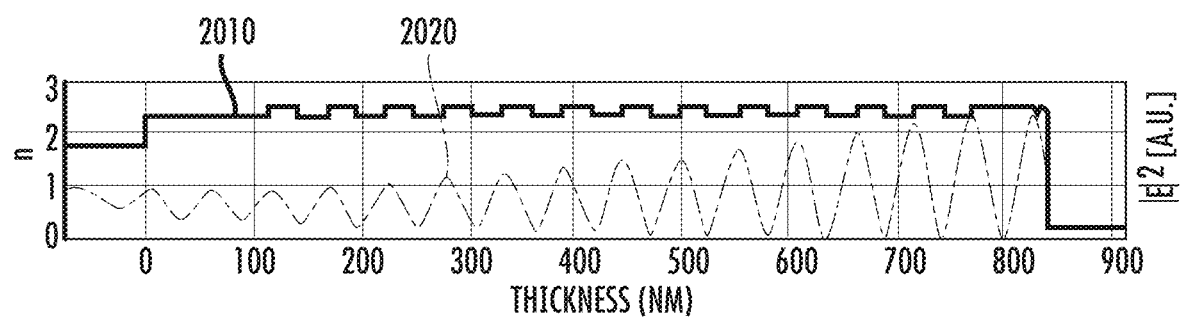
FIG. 20 is a plot of the calculated real (n) component of the refractive index, of epitaxial layers in an LED, and of the electric field squared amplitude of a UV light reflected by such those layers, in accordance with some embodiments.

FIG. 20 schematically shows the simulated real (n) part of the refractive index 2010, calculated at a wavelength $\lambda=265$ nm, for a cavity LED structure similar to the one in FIG. 19A. The structure contains a $\lambda/n_{AlN}$ thick AlN buffer layer, where $n_{AlN}$ is the refractive index of the AlN material, followed by a 12-period DBR, an approximately $\lambda/2n_i$ thick cavity layer, where $n_i$ is the refractive index of the cavity layer, an 11 nm-thick ohmic-chirp layer, and an Al reflective contact. The squared electric field amplitude 2020, for a $\lambda=265$ nm mode impinging from the sapphire side, is also shown. This wavelength corresponds to the cavity mode, which has an antinode 15 nm away from the metal contact. If electrons and holes recombine at this location, then light extraction can be enhanced due to the cavity effect.

Figure 21A:
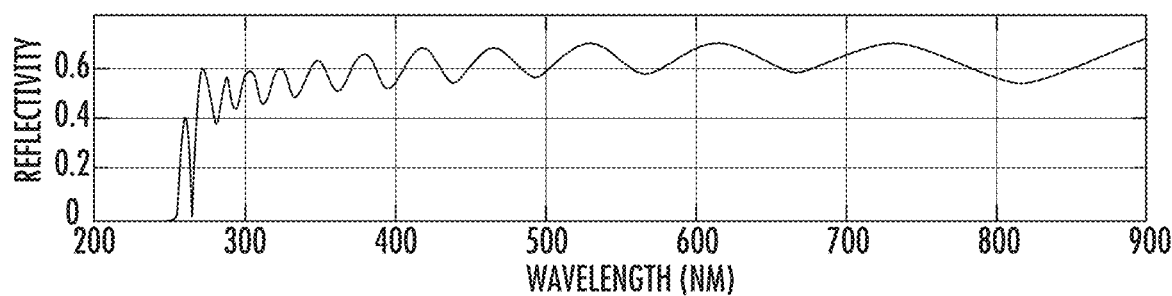
FIG. 21A is a plot of the calculated reflectivity spectrum of LED structures, in accordance with some embodiments.

FIG. 21A shows the calculated reflectivity spectrum, probed from the sapphire side, of the structure simulated in FIG. 20. The clear dip at $\lambda=265$ nm corresponds to the cavity mode. Below ~250 nm, nearly the whole structure is absorptive yielding almost no reflection.

Figure 21B:
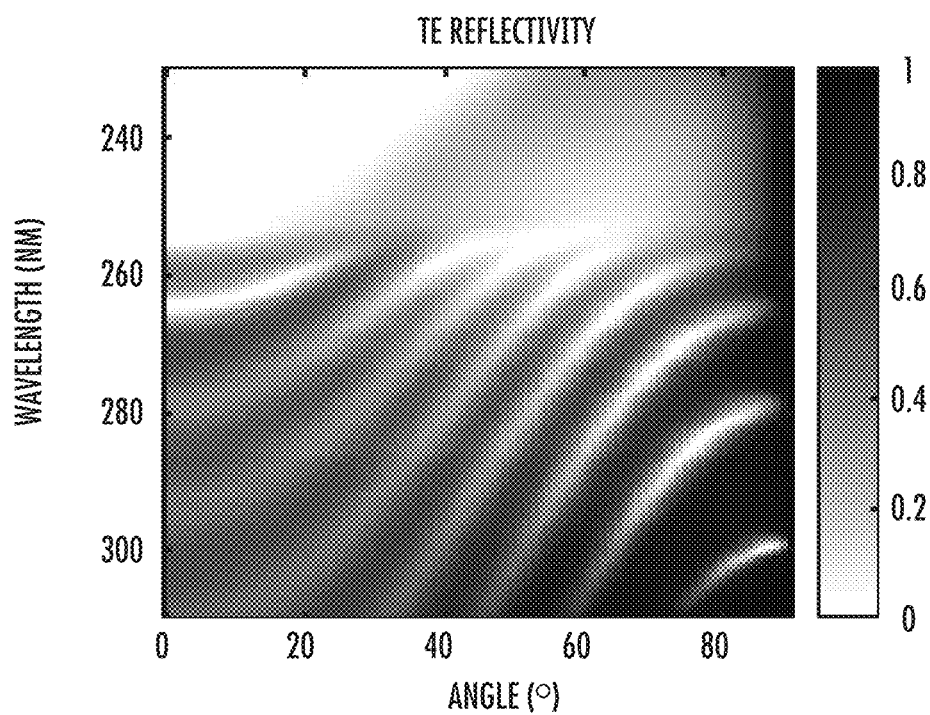
FIG. 21B is a plot of the calculated reflectivity spectrum of LED structures, as a function of angle of incidence, in accordance with some embodiments.

FIG. 21B shows the same reflectivity spectrum, with wavelength on the y-axis (zoomed in around 265 nm), and with the angle of incidence on the x-axis. As the effective layer length gets longer at oblique angles, the cavity resonance shifts to longer wavelengths. When such devices are mass manufactured, different devices will tend to have slightly different dimensions due to manufacturing variability. In some embodiments, small mismatches between emitter wavelength and cavity resonance will cause the light to be emitted at an angle rather than perpendicularly to the device.

Figure 22A:
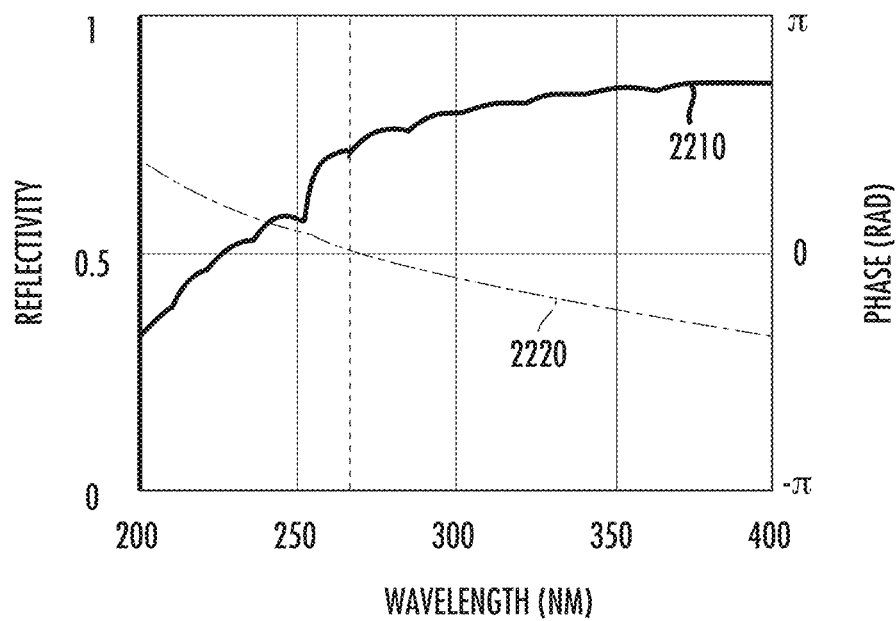
FIG. 22A is a plot of the calculated reflectivity spectrum of a material structure, in accordance with some embodiments.

FIG. 22A shows a plot of the reflectivity 2210 and reflection phase 2220 of the interface between an ohmic-chirp and an aluminium contact mirror (e.g., similar to those in FIG. 19A) probed from the cavity antinode (i.e., 15 nm away from the contact). The plot shows that at $\lambda=265$ nm, R>70% and the phase equals zero, which confirms constructive interference.

Figure 22B:
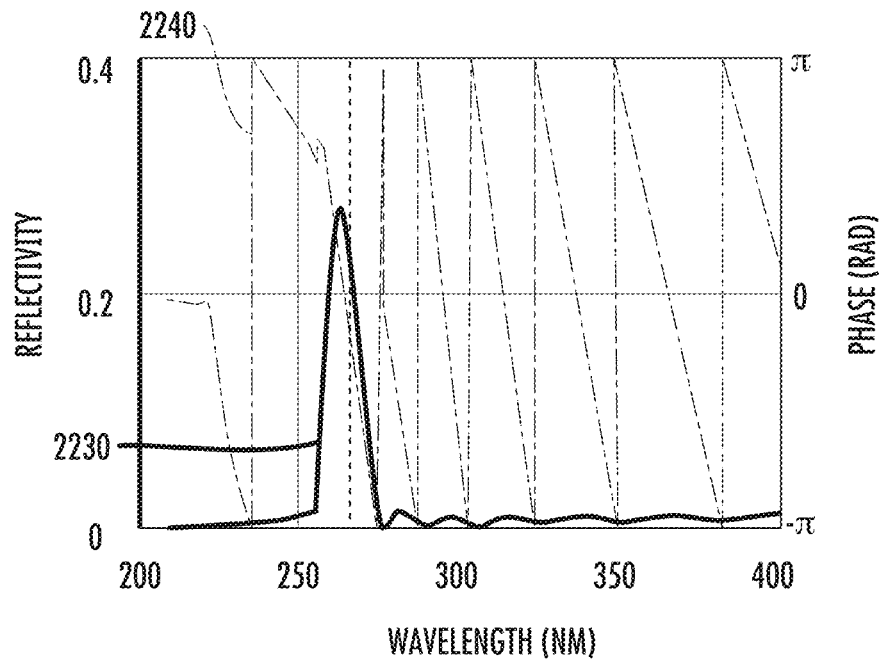
FIG. 22B is a plot of the calculated reflectivity spectrum of an epitaxial structure, in accordance with some embodiments.

FIG. 22B shows the reflectivity 2230 and reflection phase 2240 of the interface between the DBR and the buffer layers 2200 (e.g., similar to those in FIG. 19A) probed from the cavity antinode (15 nm away from the contact). At $\lambda=265$ nm, R~27% and the phase equals zero, again confirming constructive interference. The maximum reflectivity is smaller than previously estimated using ternary mixes, because a smaller refractive index contrast, ~4%, was used in this example to be consistent with what can be achieved from a n-SSL in practice (e.g., using molecular beam epitaxy growth techniques). From this reflectivity we can expect a directional emission enhancement factor $G_{int}$~4 (e.g., as shown in the plot in FIG. 14B). In addition, this reflectivity value could increase as the total cavity length gets reduced, since the DBR penetration length is about 480 nm in this case.

Figure 23:
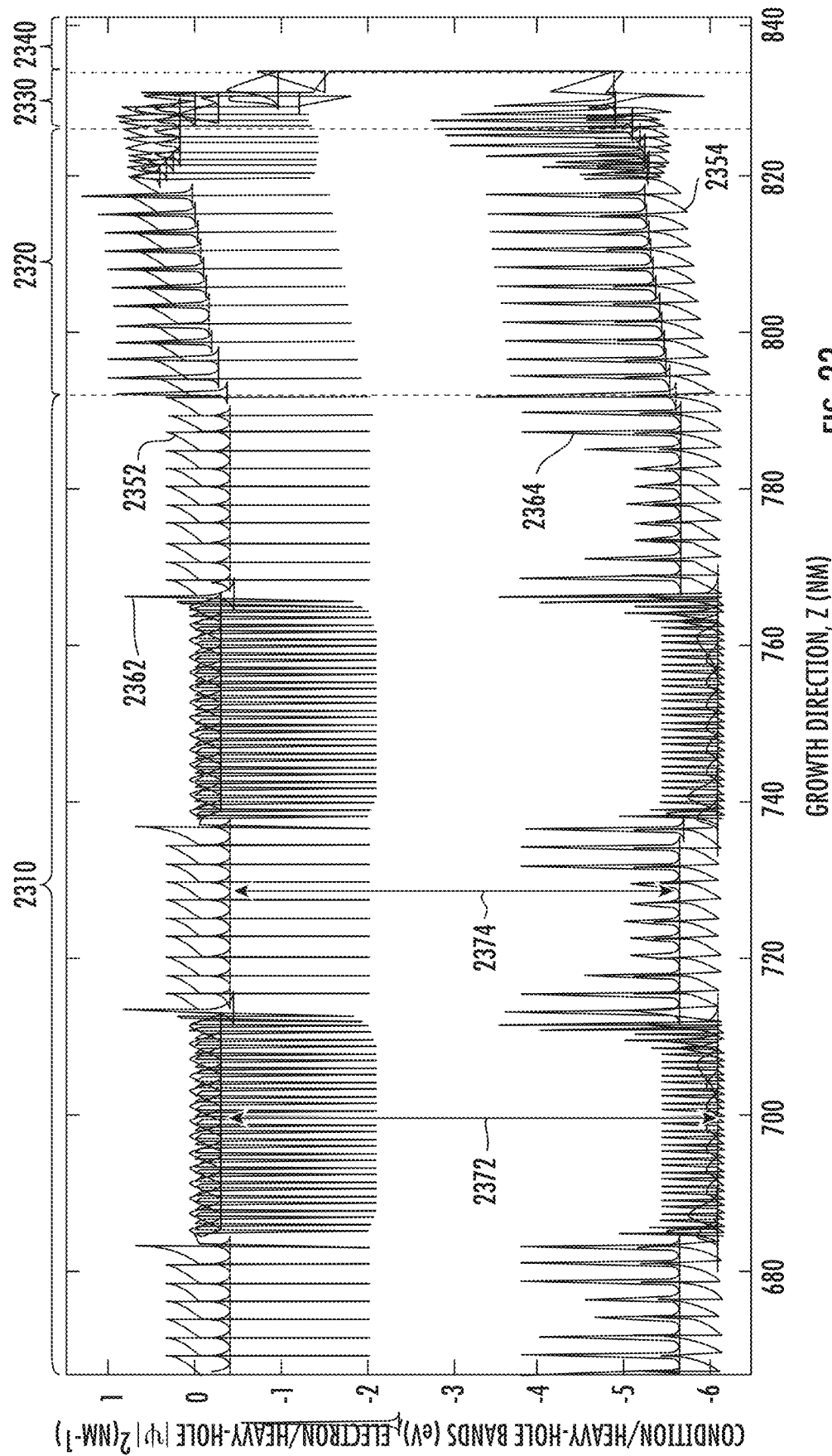
FIG. 23 is a plot of simulations of the band structure and electron and hole wavefunctions of an LED structure, in accordance with some embodiments.

FIG. 23 shows part of the band diagram of an LED structure similar to the one shown in FIG. 19A and the one simulated in FIG. 20, under an applied forward bias of 4.9 V, or just under flat-band operation. The figure includes an n-SSL layer 2310, an i-SSL layer 2320, an ohmic-chirp layer 2330, and a metal contact 2340. In this example, the underlying digital AlN/GaN conduction band edge 2352 and valence band edge 2354 values are shown, together with the electron wavefunctions 2362 and hole wavefunction 2364 that are solutions to that underlying potential. The electron and hole wavefunctions 2362 and 2364 in FIG. 23 are plotted such that the baseline of each of the wavefunctions (i.e., $|\psi|^2=0$, where $\psi$ is the wavefunction) is aligned with their energies (in the y-axis). The y-axis in FIG. 23 also shows the magnitude (e.g., height of the wavefunction) of each of the wavefunctions $|\psi|^2$, however, as described above the values on the y-axis relate to the baseline energy of the wavefunctions, and only the intervals in the y-axis are related to the magnitude of the wavefunctions.

The varying SPSL composition throughout the n-SSL layer 2310 causes a periodic modulation of the local effective bandgap (measured as the distance between electron and hole wavefunction baselines). In this example, the average composition is constant throughout the n-SSL, but the widths of the wells and barriers are changed to change the average bandgaps in the SPSL layers making up the DBR layers in the n-SSL layer 2310. In the example in FIG. 23, the average bandgap 2372 in some of the SPSL layers is larger than the average bandgap 2374 in the other of the SPSL layers. The difference in average bandgaps in the SPSLs making up the DBR layers in the n-SSL layer 2310 in this example is about 0.5 eV. The average bandgap contrast is mainly responsible for the refractive index contrast between these effective DBR layers. FIG. 23 also shows that, despite the strong contrast in average bandgap between the DBR layers, the electron wavefunction baselines barely change from one DBR layer into another. In the example shown in the figure, the baselines of the electron wavefunctions 2362 within the n-SSL DBR layers are within about 0.1 eV of one another. This is due to the efficient electron doping caused by SPSLs. In fact, the doped AlN barriers strongly pull the local Fermi level upwards, up to a point where it is above the confined energy states in the wells. As a result, there is a strong electron density in the wells, leading to a very efficient electron doping. Furthermore, to maintain Fermi level continuity, the band edges of the high-Al content SPSL are pushed downwards, which causes all the electron wavefunction to align in the n-SSL. As a result, there is a low energy barrier for electron transport, which is beneficial for device performance. The baseline positions of the hole wavefunctions 2364 in FIG. 23 also shows that nearly all bandgap modulation in the n-SSL is contained within the valence band.

FIG. 23 also shows some other features of the LED, namely the intrinsic SPSL layer 2320 where the optical recombination occurs, followed by an electron blocking layer (energy barrier) shown by a step up in the baselines of the electron wavefunctions 2362 near the end of the intrinsic SPSL layer 2320 near the ohmic-chirp layer 2330.

Figure 24A:
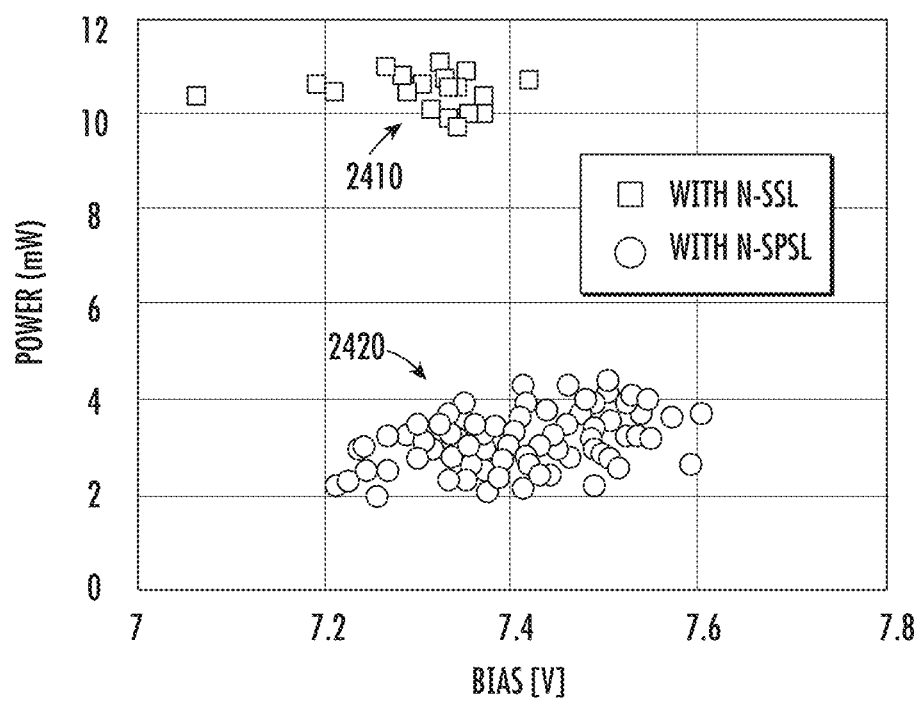
FIG. 24A is a plot of the measured output power of various LED devices, with or without an n-doped super-superlattice structure, in accordance with some embodiments.

FIG. 24A shows the measured output power 2410 of 21 example devices with structures very similar to the ones described in FIGS. 20 and 23, together with measured output power 2420 from 110 devices that are identical except that they have a normal n-SPSL, with a single constant total aluminum composition, instead of an n-SSL containing a DBR. The n-SSL layer with the DBR improved output power in this example by more than a factor of 3, with no drive voltage penalty. This improvement could be caused by the expected improvement in light extraction efficiency due to the cavity enhancement. It could also be related to a reduced defect density in the device active layer caused by, for example, enhanced threading dislocation (TD) annihilation in the n-SSL structure due to stimulated TD bending at the DBR interfaces.

Figure 24B:
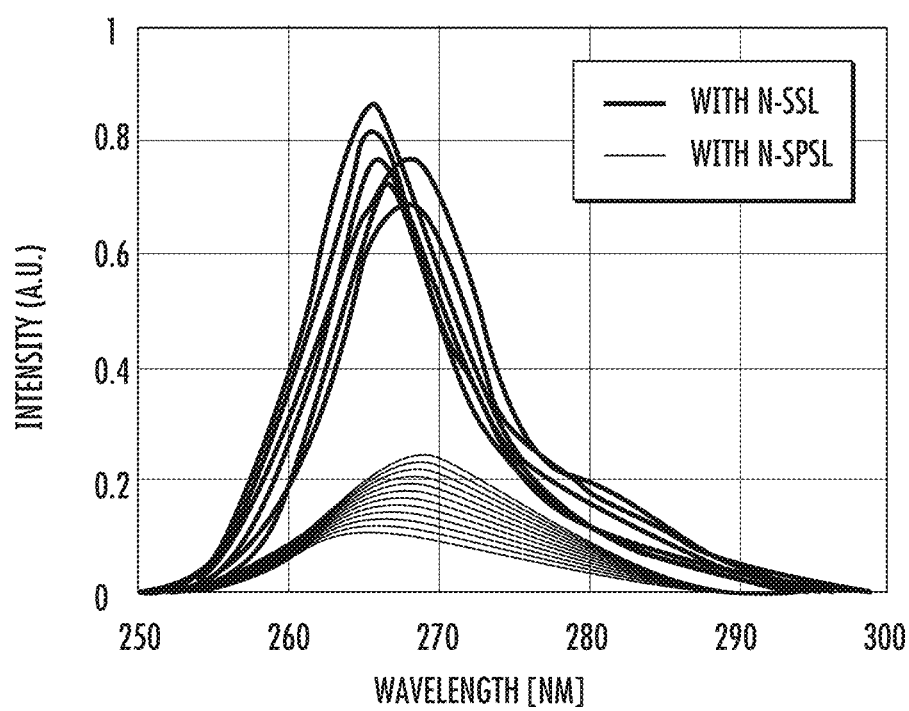
FIG. 24B is a plot of the measured emission spectrum of various LED devices, with or without an n-doped super-superlattice structure, in accordance with some embodiments.

FIG. 24B shows the emission spectral dependence of the devices shown in FIG. 24A, confirming peak wavelengths between 265-269 nm for all of the devices.

In some embodiments, the structures and devices described herein contain a contact layer with steep composition grading of one or more piezoelectric materials close to a metal interface to create an ohmic contact, or a contact with reduced contact resistance compared to conventional structures. A steep composition grading of one or more piezoelectric materials close to a metal interface can be realized and/or applied in many different ways and using many different materials apart from what is described above. A few additional non-limiting examples will now be described.

If the goal is to reduce the Schottky resistance of a n-contact (i.e., a contact to an n-type material), then in some embodiments, AlN, GaN and/or AlGaN materials also be used with metal-polar faces facing the n-contact metal layer. In such cases, contact layers or ohmic-chirp layers similar to those described above can be used with the composition grading within the ohmic-chirp layer ending with a high-aluminium composition (rather than a lower aluminium composition as in some of the previous examples). In some embodiments, contact layers or ohmic-chirp layers with metal-polar growth faces have the advantage that no absorptive layers (i.e., no layers with an effective bandgap low enough to absorb the emitted light), no matter how thin, is needed.

If the goal is to reduce the Schottky resistance of a n-contact (i.e., a contact to an n-type material), then in some embodiments, AlN, GaN and/or AlGaN materials be used with nitrogen-polar faces facing the n-contact metal layer. In such cases, contact layers or ohmic-chirp layers similar to those described above can be used with the composition grading within the ohmic-chirp layer ending with a low-aluminium composition.

If the goal is to reduce the Schottky resistance of a p-contact (i.e., a contact to a p-type material), then in some embodiments, AlN, GaN and/or AlGaN materials with nitrogen-polar faces facing the p-contact metal layer can be used, provided that the aluminium composition is graded and ends with a high-aluminium composition close to the metal contact. Furthermore, other types of compositional gradients (e.g., smooth gradients, or stepped compositional changes, rather than chirped layers) can also be used with metal-polar faces and composition grading ending with a low-aluminium composition for p-contacts. Conversely, in some embodiments, AlN, GaN and/or AlGaN materials with nitrogen-polar faces contain a graded composition that ends with a low aluminium composition next to the n-contact.

In some embodiments, the graded, or chirped, region is thin, however the exact way the composition is graded down can take many forms (e.g., chirped layers, smooth gradients, or stepped compositional changes). For example, simulations show that simply putting one thin (roughly 1 nm thick) low Al content $Al_xGa_{1-x}N$ layer in front of a high Al content metal-polar $Al_xGa_{1-x}N$ layer (where the low Al content layer is next to the metal contact) is enough to reduce the Schottky resistance considerably.

In some embodiments, a graded (or chirped) AlN/GaN SPSL can be used in a semiconductor-metal junction to create a low resistance p-contact containing an AlN/GaN SPSL with metal-polar faces facing the metal layer, and a gradient in the AlN, GaN and/or $Al_xGa_{1-x}N$ sublayer thicknesses with low AlN content adjacent to the semiconductor/metal interface. For example, the AlN sublayers can be thicker at the beginning of the SPSL (farther from the metal contact) and thinner at the end of the SPSL (nearer to the metal contact). In another example, the GaN sublayers can be thinner at the beginning of the SPSL (farther from the metal contact) and thicker at the end of the SPSL (nearer to the metal contact). In another example, the AlN sublayers can be thicker at the beginning of the SPSL (farther from the metal contact) and thinner at the end of the SPSL (nearer to the metal contact), and the GaN sublayers can be thinner at the beginning of the SPSL (farther from the metal contact) and thicker at the end of the SPSL (nearer to the metal contact).

In some embodiments, a graded (or chirped) AlN/GaN SPSL can be used in a semiconductor-metal junction to create a low resistance n-contact containing an AlN/GaN SPSL with metal-polar faces facing the metal layer, and a gradient in the AlN, GaN and/or $Al_xGa_{1-x}N$ sublayer thicknesses with high AlN content adjacent to the semiconductor/metal interface. For example, the AlN sublayers can be thinner at the beginning of the SPSL (farther from the metal contact) and thicker at the end of the SPSL (nearer to the metal contact). In another example, the GaN sublayers can be thicker at the beginning of the SPSL (farther from the metal contact) and thinner at the end of the SPSL (nearer to the metal contact). In another example, the AlN sublayers can be thinner at the beginning of the SPSL (farther from the metal contact) and thicker at the end of the SPSL (nearer to the metal contact), and the GaN sublayers can be thicker at the beginning of the SPSL (farther from the metal contact) and thinner at the end of the SPSL (nearer to the metal contact).

In some embodiments, a graded (or chirped) AlN/GaN SPSL can be used in a semiconductor-metal junction to create a low resistance p-contact containing an AlN/GaN SPSL with nitrogen-polar faces facing the metal layer, and a gradient in the AlN, GaN and/or $Al_xGa_{1-x}N$ sublayer thicknesses with high AlN content adjacent to the semiconductor/metal interface. For example, the AlN sublayers can be thinner at the beginning of the SPSL (farther from the metal contact) and thicker at the end of the SPSL (nearer to the metal contact). In another example, the GaN sublayers can be thicker at the beginning of the SPSL (farther from the metal contact) and thinner at the end of the SPSL (nearer to the metal contact). In another example, the AlN sublayers can be thinner at the beginning of the SPSL (farther from the metal contact) and thicker at the end of the SPSL (nearer to the metal contact), and the GaN sublayers can be thicker at the beginning of the SPSL (farther from the metal contact) and thinner at the end of the SPSL (nearer to the metal contact).

In some embodiments, a graded (or chirped) AlN/GaN SPSL can be used in a semiconductor-metal junction to create a low resistance n-contact containing an AlN/GaN SPSL with nitrogen-polar faces facing the metal layer, and a gradient in the AlN, GaN and/or $Al_xGa_{1-x}N$ sublayer thicknesses with low AlN content adjacent to the semiconductor/metal interface. For example, the AlN sublayers can be thicker at the beginning of the SPSL (farther from the metal contact) and thinner at the end of the SPSL (nearer to the metal contact). In another example, the GaN sublayers can be thinner at the beginning of the SPSL (farther from the metal contact) and thicker at the end of the SPSL (nearer to the metal contact). In another example, the AlN sublayers can be thicker at the beginning of the SPSL (farther from the metal contact) and thinner at the end of the SPSL (nearer to the metal contact), and the GaN sublayers can be thinner at the beginning of the SPSL (farther from the metal contact) and thicker at the end of the SPSL (nearer to the metal contact).

In addition to creating a piezoelectric field gradient and polarization doping adjacent to a contact using a compositional gradient, it is also possible to induce polarization charges using strain only, or compositional gradients and strain gradients together, in some embodiments. For example, a constant composition piezoelectric material can be used where the strain is steeply changed, adjacent to a metal contact, either in z or in the x-y plane as a function of z (where z is the growth direction, and the x-y plane is perpendicular to the growth direction), to create a layer with a high polarization-induced electric field. Therefore, in various embodiments (e.g., to form p-contacts or n-contacts) strain can be engineered into piezoelectric materials to create the high polarization-induced electric field (instead of, or in addition to, compositional gradients) that advantageously affects semiconductor-metal interface properties (as described in detail above for chirped layers). Similar to the different embodiments of compositionally graded contact layers described above, strained contact layers can be engineered to create low resistance ohmic contacts to either n- or p-contacts. For example, the contact layer can be designed for n- or p-contacts by changing the crystal orientation (e.g., metal-polar or nitrogen-polar), and/or the type of strain (e.g., compressive or tensile) within the region in the contact layer adjacent to the metal.

Furthermore, the contact layer or ohmic-chirp layer requires piezoelectric materials whose spontaneous and/or induced piezoelectric polarization depends on material composition and/or strain, and these materials are not limited to AlGaN materials. Therefore, contact layers (e.g., ohmic-chirp layers, layers with smooth compositional gradients, or layers with strain gradients, as described above) can be created not only from AlGaN-based materials but from many more. For example, contact layers that provide reduced contact resistance with a metal contact (compared to conventional structures) can be made from InGaN-based, or AlInGaN-based materials. These materials can be useful, for example, in UVA and blue LEDs, and therefore it is anticipated that the concepts, structures, and devices described herein can have an important impact in these materials systems and devices as well as in UVC LEDs based on AlGaN materials. In another example, some wurtzite semiconductors (e.g., ZnO, and w-BN) are piezoelectric, and therefore could also be used to create contact layers that provide reduced contact resistance for a semiconductor-metal contact (compared to conventional structures).

Furthermore, contact layers, ohmic-chirp layers, layers with compositional gradients, or layers with strain (as described above) that provide reduced contact resistance with a metal contact (compared to conventional structures) are not limited to LED applications, but can also be used in any applications that require low resistance ohmic contact to semiconductor materials (e.g., to high-bandgap piezoelectric materials). Some non-limiting examples include high-mobility RF transistors, and high-breakdown power transistors.

On the other hand, some other applications need a resistance across a semiconductor/metal interface that is as high as possible (e.g., through the use of high Schottky barriers), such as in high-voltage Schottky diodes, or control gates in RF- and power-transistors. In these cases, chirp layers, layers with compositional gradients, or layers with strain similar to those described above can also be applied, in a reversed fashion, to hinder carrier transport across the semiconductor/metal interface. For example, a metal-polar AlGaN material can be graded up to high aluminium content at the metal contact interface, which would create electric fields that could increase the p-contact resistance for holes compared to a homogeneous AlGaN/metal interface. More generally, as described above, depending on the polarity of the growth faces, and the application to an n- or p-contact, a chirp layer, layer with compositional gradient, or layer with strain (as described above) can be tailored to different situations, for example, by reversing the grading direction or the growth polarity to hinder carrier transport across the semiconductor/metal interface.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A semiconductor structure, comprising:
   a semiconductor layer;
   a metal layer; and
   a contact layer adjacent to the metal layer, and between the semiconductor layer and the metal layer, comprising:
      one or more piezoelectric materials comprising spontaneous piezoelectric polarization that depends on material composition; and
      a region comprising a gradient in materials composition adjacent to the metal layer,
   wherein the contact layer forms an n-contact with the metal layer; and
   wherein the contact layer comprises an ohmic-chirp layer comprising:
      alternating wide bandgap sublayers and narrow bandgap sublayers;
      a compositional gradient formed by varying thicknesses of the sublayers through the contact layer;
      AlN, GaN and/or AlGaN materials with metal-polar faces facing the metal layer;
      an average aluminium nitride content per period; and
      a gradient in the average aluminium nitride content per period comprising a higher average aluminium nitride content per period close to the metal layer and a lower average aluminium nitride content per period farther away from the metal layer.

2. The semiconductor structure of claim 1, wherein:
   the semiconductor layer comprises a bandgap greater than 1.5 eV, greater than 2.0 eV, greater than 2.5 eV, greater than 3.0 eV, greater than 4.0 eV, greater than 5.0 eV, greater than 6.0 eV, from 1.5 eV to 7.0 eV, or from 3.0 eV to 7.0 eV.

3. The semiconductor structure of claim 1, wherein:
   the metal layer is selected from the group consisting of Al, Ti, Ta, Ni, Pt, Au, Ag, Ru, Os, Co, W, Zn, Sn, Pd, and Cu.

4. The semiconductor structure of claim 1, wherein:
   the region comprising the gradient in materials composition within the contact layer comprises a thickness from greater than 0 nm to less than 20 nm.

5. The semiconductor structure of claim 1, wherein:
   the piezoelectric materials within the contact layer are selected from the group consisting of AlN, GaN, InN, AlGaN, InGaN, AlInGaN, ZnO, w-BN, and other wurtzite semiconductors.

6. The semiconductor structure of claim 1, wherein:
   the contact layer comprises doping within the region comprising the gradient in materials composition.

7. A semiconductor device comprising the semiconductor structure of claim 1,
   wherein:
   the semiconductor device is selected from the group consisting of optoelectronic devices with wavelengths ranging from infra-red to deep-ultraviolet, light emitting diodes, laser diodes, photodetectors, solar cells, high-power diodes, high-power transistors, transducers and high-mobility transistors.

8. A light emitting diode device, comprising:
   an n-doped short period superlattice (SPSL) layer;
   an intrinsically doped AlN/GaN SPSL layer adjacent to the n-doped SPSL layer;
   a metal layer; and
   an ohmic-chirp layer, wherein a beginning of the ohmic-chirp layer is adjacent to the intrinsically doped AlN/GaN SPSL layer, an end of the ohmic-chirp layer is adjacent to the metal layer, and the ohmic-chirp layer comprises:
      an AlN/GaN SPSL comprising alternating AlN and GaN sublayers; and
      a gradient in thicknesses of the alternating AlN and GaN sublayers in a region of the ohmic-chirp layer adjacent to the metal layer.

9. The light emitting diode device of claim 8, wherein the ohmic-chirp layer further comprises:
   a spontaneous piezoelectric polarization field in the region of the ohmic-chirp layer adjacent to the metal layer.

10. The light emitting diode device of claim 8, wherein:
    the AlN sublayers are thicker at the beginning of the ohmic-chirp layer than at the end of the ohmic-chirp layer.

11. The light emitting diode device of claim 8, wherein:
    the GaN sublayers are thicker at the end of the ohmic-chirp layer than at the beginning of the ohmic-chirp layer.

12. The light emitting diode device of claim 8, wherein:
    the AlN sublayers are thicker at the beginning of the ohmic-chirp layer than at the end of the ohmic-chirp layer; and
    the GaN sublayers are thicker at the end of the ohmic-chirp layer than at the beginning of the ohmic-chirp layer.

13. The light emitting diode device of claim 8, wherein:
    the GaN sublayers are thicker at the end of the ohmic-chirp layer than at the beginning of the ohmic-chirp layer;
    the AlN sublayer thicknesses are graded towards the end of the ohmic-chirp layer; and the AlN sublayers are thicker at the beginning of the ohmic-chirp layer than at the end of the ohmic-chirp layer.

14. The light emitting diode device of claim 8, wherein: the ohmic-chirp layer further comprises a p-type dopant.

15. The light emitting diode device of claim 14, wherein: the p-type dopant is located throughout the entire ohmic-chirp layer.

16. The light emitting diode device of claim 14, wherein: the p-type dopant is located in a doped region of the ohmic-chirp layer adjacent to the metal layer; and the doped region has a thickness from 1 nm to 10 nm.

17. The light emitting diode device of claim 8, wherein: the light emitting diode device emits light of a first wavelength;
the light is extracted in a light extraction direction;
the metal layer is reflective at the first wavelength; and
a distance from the intrinsically doped AlN/GaN SPSL layer to the metal layer generates constructive interference of the light of the first wavelength in the light extraction direction.

18. The light emitting diode device of claim 8, further comprising:
an n-doped super-superlattice (SSL) layer comprising the n-doped short period superlattice (SPSL) layer.

19. The light emitting diode device of claim 18, wherein:
the n-doped super-superlattice (SSL) further comprises AlN/GaN short-period superlattices (SPSLs) comprising different average bandgaps.

20. The light emitting diode device of claim 18, wherein:
the n-doped super-superlattice (SSL) further comprises AlN/GaN short-period superlattices (SPSLs) comprising different average bandgaps to form a distributed Bragg reflector (DBR).

21. The light emitting diode (LED) device of claim 20, wherein:
light from the LED is emitted through the n-doped super-superlattice (SSL);
the distributed Bragg reflector (DBR) in the n-doped SSL and an interface between the metal layer and the ohmic-chirp layer forms an optical cavity; and
a reflectivity of the DBR, a reflectivity of the interface between the metal layer and the ohmic-chirp layer, and a position of the intrinsically doped AlN/GaN SPSL layer within the optical cavity are chosen such that a total directional emission enhancement $G_{int}$ is from 2 to 10.

* * * * *